United States Patent
Jung et al.

(10) Patent No.: US 9,786,389 B2
(45) Date of Patent: Oct. 10, 2017

(54) MEMORY SYSTEM

(71) Applicant: SK hynix Inc., Gyeonggi-do (KR)

(72) Inventors: Hoe-Kwon Jung, Gyeonggi-do (KR);
Min-Chang Kim, Gyeonggi-do (KR);
Chang-Hyun Kim, Gyeonggi-do (KR);
Do-Yun Lee, Gyeonggi-do (KR);
Yong-Woo Lee, Gyeonggi-do (KR);
Jae-Jin Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/291,862

(22) Filed: Oct. 12, 2016

(65) Prior Publication Data
US 2017/0110207 A1 Apr. 20, 2017

Related U.S. Application Data

(60) Provisional application No. 62/242,786, filed on Oct. 16, 2015.

(51) Int. Cl.
| | | |
|---|---|---|
| *G11C 13/00* | (2006.01) | |
| *G11C 11/00* | (2006.01) | |
| *G11C 29/00* | (2006.01) | |
| *G06F 12/0802* | (2016.01) | |
| *G06F 3/06* | (2006.01) | |
| *G06F 13/16* | (2006.01) | |
| *G11C 29/44* | (2006.01) | |

(52) U.S. Cl.
CPC ............ *G11C 29/70* (2013.01); *G06F 3/0622* (2013.01); *G06F 3/0626* (2013.01); *G06F 3/0659* (2013.01); *G06F 3/0685* (2013.01); *G06F 12/0802* (2013.01); *G06F 13/1668* (2013.01); *G11C 29/4401* (2013.01); *G06F 2212/60* (2013.01)

(58) Field of Classification Search
CPC . G11C 11/4091; G11C 11/4093; G11C 7/065;
G11C 7/1006; G11C 8/12; G11C 8/16;
G11C 13/0004; G11C 7/20; G11C 8/10;
G11C 11/16; G11C 11/4072; G11C
11/408; G11C 11/412; G11C 13/00; G11C
13/0002; G11C 13/0069; G11C 5/06;
G11C 8/08; G11C 8/18; G11C 16/10
See application file for complete search history.

(56) References Cited

U.S. PATENT DOCUMENTS

| | | | |
|---|---|---|---|
| 9,317,429 B2 | 4/2016 | Ramanujan et al. | |
| 9,342,453 B2 | 5/2016 | Nale et al. | |
| 2008/0147932 A1* | 6/2008 | Fukazawa | G06F 11/2089 710/74 |
| 2008/0198646 A1* | 8/2008 | Park | G11C 13/0007 365/148 |
| 2014/0059269 A1* | 2/2014 | Park | G06F 12/0246 711/102 |

(Continued)

*Primary Examiner* — Hien Nguyen
(74) *Attorney, Agent, or Firm* — IP & T Group LLP

(57) ABSTRACT

A memory system includes: a first memory device including a first memory and a first memory controller suitable for controlling the first memory to store data; a second memory device including a second memory and a second memory controller suitable for controlling the second memory to store data; and a processor suitable for executing an operating system (OS) and an application, and accessing data storage memory through the first and second memory devices.

18 Claims, 15 Drawing Sheets

(56) References Cited

U.S. PATENT DOCUMENTS

2015/0138884 A1* 5/2015 Park .................. G06F 13/385
                                                365/185.08
2015/0261698 A1* 9/2015 Zhang ................ G06F 13/1621
                                                711/156

* cited by examiner

MEMORY SYSTEM

CROSS-REFERENCE TO RELATED APPLICATION

The present application claims priority to U.S. Provisional Application No. 62/242,786 filed on Oct. 16, 2015, which is incorporated herein by reference in its entirety.

BACKGROUND

1. Field

Various embodiments relate to a memory system, and more particularly, a memory system including plural heterogeneous memories coupled to a common bus and having different latencies.

2. Description of the Related Art

In conventional computer systems, a system memory, a main memory, a primary memory, or an executable memory is typically implemented by the dynamic random access memory (DRAM). The DRAM-based memory consumes power even when no memory read operation or memory write operation is performed to the DRAM-based memory. This is because the DRAM-based memory should constantly recharge capacitors included therein. The DRAM-based memory is volatile, and thus data stored in the DRAM-based memory is lost upon removal of the power.

Conventional computer systems typically include multiple levels of caches to improve performance thereof. A cache is a high speed memory provided between a processor and a system memory in the computer system to perform an access operation to the system memory faster than the system memory itself in response to memory access requests provided from the processor. Such cache is typically implemented with a static random access memory (SRAM). The most frequently accessed data and instructions are stored within one of the levels of cache, thereby reducing the number of memory access transactions and improving performance.

Conventional mass storage devices, secondary storage devices or disk storage devices typically include one or more of magnetic media (e.g., hard disk drives), optical media (e.g., compact disc (CD) drive, digital versatile disc (DVD), etc.), holographic media, and mass-storage flash memory (e.g., solid state drives (SSDs), removable flash drives, etc.). These storage devices are Input/Output (I/O) devices because they are accessed by the processor through various I/O adapters that implement various I/O protocols. Portable or mobile devices (e.g., laptops, netbooks, tablet computers, personal digital assistant (PDAs), portable media players, portable gaming devices, digital cameras, mobile phones, smartphones, feature phones, etc.) may include removable mass storage devices (e.g., Embedded Multimedia Card (eMMC), Secure Digital (SD) card) that are typically coupled to the processor via low-power interconnects and I/O controllers.

A conventional computer system typically uses flash memory devices allowed only to store data and not to change the stored data in order to store persistent system information. For example, initial instructions such as the basic input and output system (BIOS) images executed by the processor to initialize key system components during the boot process are typically stored in the flash memory device. In order to speed up the BIOS execution speed, conventional processors generally cache a portion of the BIOS code during the pre-extensible firmware interface (PEI) phase of the boot process.

Conventional computing systems and devices include the system memory or the main memory, consisting of the DRAM, to store a subset of the contents of system non-volatile disk storage. The main memory reduces latency and increases bandwidth for the processor to store and retrieve memory operands from the disk storage.

The DRAM packages such as the dual in-line memory modules (DIMMs) are limited in terms of their memory density, and are also typically expensive with respect to the non-volatile memory storage. Currently, the main memory requires multiple DIMMs to increase the storage capacity thereof, which increases the cost and volume of the system. Increasing the volume of a system adversely affects the form factor of the system. For example, large DIMM memory ranks are not ideal in the mobile client space. What is needed is an efficient main memory system wherein increasing capacity does not adversely affect the form factor of the host system.

SUMMARY

Various embodiments of the present invention are directed to a memory system including plural heterogeneous memories coupled to a common bus and having different latencies.

In accordance with an embodiment of the present invention, a memory system may include: a first memory device including a first memory and a first memory controller suitable for controlling the first memory to store data; a second memory device including a second memory and a second memory controller suitable for controlling the second memory to store data; and a processor suitable for executing an operating system (OS) and an application, and accessing data storage memory through the first and second memory devices. The first and second memories may be separated from the processor. The processor may access the second memory device through the first memory device. The first memory controller may transfer a signal between the processor and the second memory device based on values of a memory selection field and a handshaking information field included in the signal. The second memory device may include: a stacked memory cell array including a plurality of stacked memory cell layers, which are vertically stacked, the respective stacked memory cell layers including a plurality of memory cell groups and/or a plurality of redundancy memory cell groups; and a repair control circuit suitable for performing a repair operation to replace a defective memory cell group among the plurality of memory cell groups with one among the plurality of redundancy memory cell groups in the stacked memory cell array.

In accordance with an embodiment of the present invention, a memory system may include: a first memory device including a first memory and a first memory controller suitable for controlling the first memory to store data; a second memory device including a second memory and a second memory controller suitable for controlling the second memory to store data; and a processor suitable for accessing the first memory, and accessing the second memory through the first memory device. The first memory controller may transfer a signal between the processor and the second memory device based on at least one of values of a memory selection field and a handshaking information field included in the signal. The second memory device may include: a stacked memory cell array including a plurality of vertically stacked memory cell layers, the respective stacked memory cell layers including a plurality of memory cell groups and/or a plurality of redundancy memory cell groups; and a repair control circuit suitable for performing a repair operation to replace a defective memory cell group among the plurality of memory cell groups with one among the plurality of redundancy memory cell groups.

DETAILED DESCRIPTION

Figure 1:
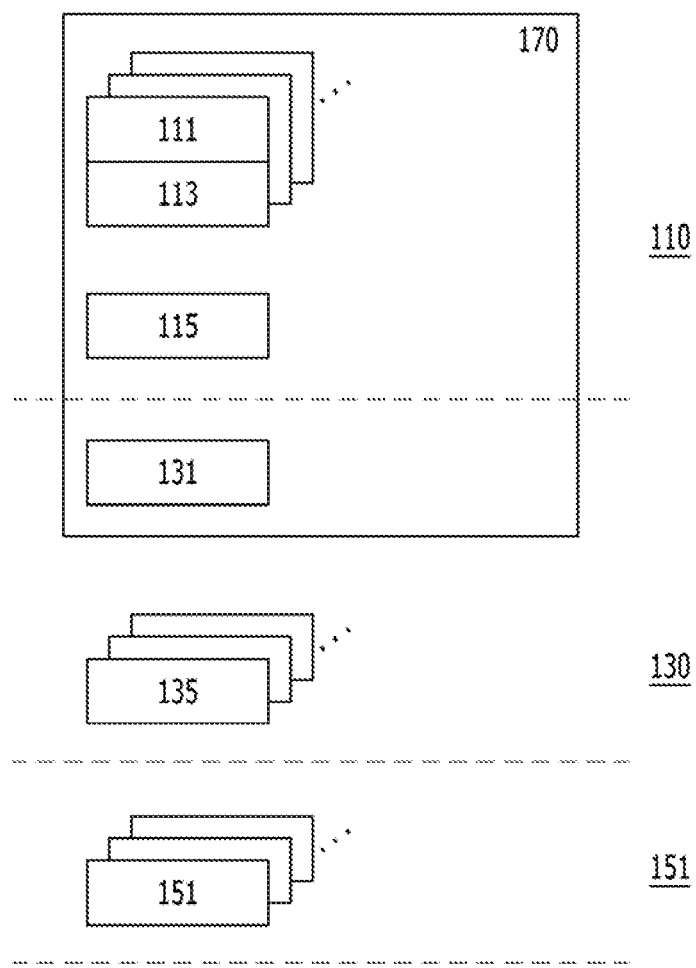
FIG. 1 is a block diagram schematically illustrating a structure of caches and a system memory according to an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. The drawings are not necessarily to scale and in some instances, proportions may have been exaggerated to clearly illustrate features of the embodiments. Throughout the disclosure, reference numerals correspond directly to like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to a case in which the first layer is formed directly on the second layer or the substrate but also a case in which a third layer exists between the first layer and the second layer or the substrate.

FIG. 1 is a block diagram schematically illustrating a structure of caches and a system memory according to an embodiment of the present invention.

Figure 2:
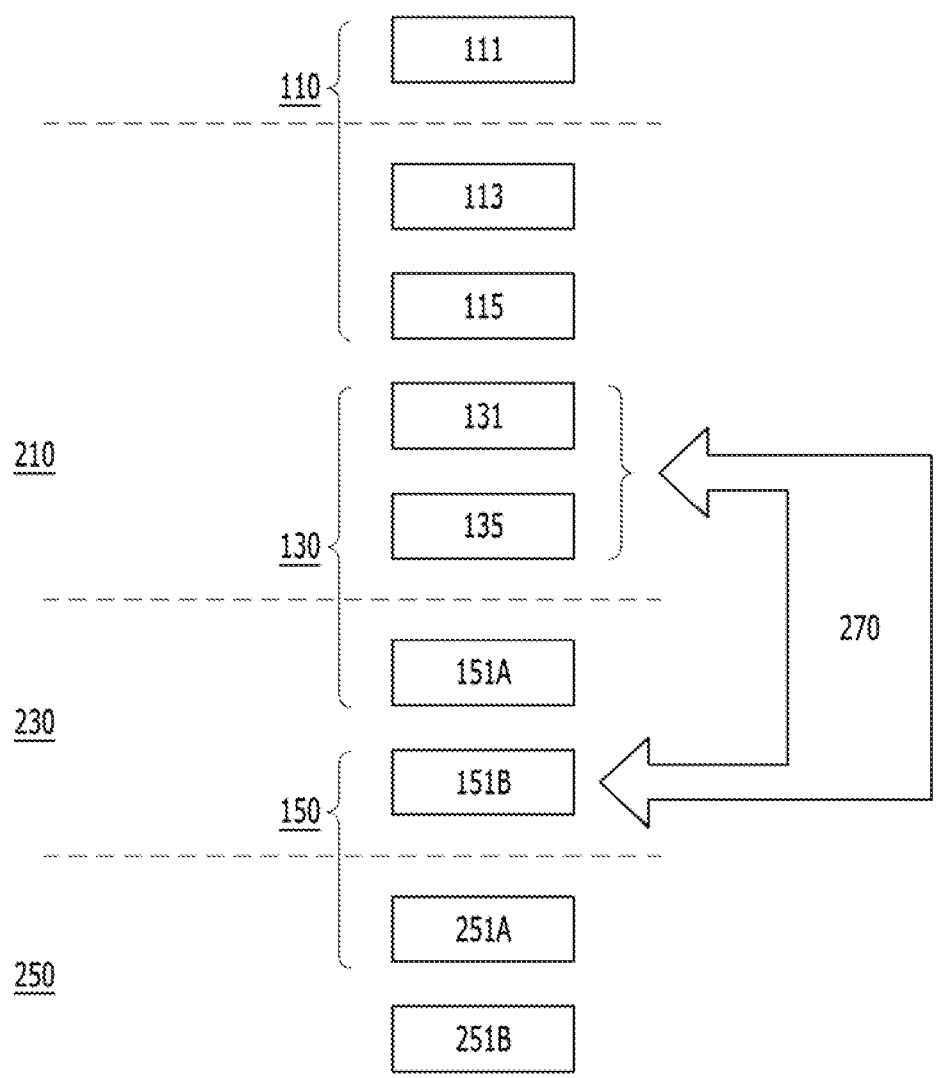
FIG. 2 is a block diagram schematically illustrating a hierarchy of cache-system memory-mass storage according to an embodiment of the present invention.

FIG. 2 is a block diagram schematically illustrating a hierarchy of cache-system memory-mass storage according to an embodiment of the present invention.

Referring to FIG. 1, the caches and the system memory may include a processor cache 110, an internal memory cache 131, an external memory cache 135 and a system memory 151. The internal and external memory caches 131 and 135 may be implemented with a first memory 130 (see FIG. 3), and the system memory 151 may be implemented with one or more of the first memory 130 and a second memory 150 (see FIG. 3).

For example, the first memory 130 may be volatile and may be the DRAM.

For example, the second memory 150 may be non-volatile and may be one or more of the NAND flash memory, the NOR flash memory and a non-volatile random access memory (NVRAM). Even though the second memory 150 may be exemplarily implemented with the NVRAM, the second memory 150 will not be limited to a particular type of memory device.

The NVRAM may include one or more of the ferroelectric random access memory (FRAM) using a ferroelectric capacitor, the magnetic random access memory (MRAM) using the tunneling magneto-resistive (TMR) layer, the phase change random access memory (PRAM) using a chalcogenide alloy, the resistive random access memory (RERAM) using a transition metal oxide, the spin transfer torque random access memory (STT-RAM), and the like.

Unlike a volatile memory, the NVRAM may maintain its content despite removal of the power. The NVRAM may also consume less power than a DRAM. The NVRAM may be of random access. The NVRAM may be accessed at a lower level of granularity (e.g., byte level) than the flash memory. The NVRAM may be coupled to a processor 170 over a bus, and may be accessed at a level of granularity small enough to support operation of the NVRAM as the system memory (e.g., cache line size such as 64 or 128 bytes). For example, the bus between the NVRAM and the processor 170 may be a transactional memory bus (e.g., a DDR bus such as DDR3, DDR4, etc.). As another example, the bus between the NVRAM and the processor 170 may be a transactional bus including one or more of the PCI express (PCIE) bus and the desktop management interface (DMI) bus, or any other type of transactional bus of a small-enough transaction payload size (e.g., cache line size such as 64 or 128 bytes). The NVRAM may have faster access speed than other non-volatile memories, may be directly writable rather than requiring erasing before writing data, and may be more re-writable than the flash memory.

The level of granularity at which the NVRAM is accessed may depend on a particular memory controller and a particular bus to which the NVRAM is coupled. For example, in some implementations where the NVRAM works as a system memory, the NVRAM may be accessed at the granularity of a cache line (e.g., a 64-byte or 128-Byte cache line), at which a memory sub-system including the internal and external memory caches 131 and 135 and the system memory 151 accesses a memory. Thus, when the NVRAM is deployed as the system memory 151 within the memory sub-system, the NVRAM may be accessed at the same level of granularity as the first memory 130 (e.g., the DRAM) included in the same memory sub-system. Even so, the level of granularity of access to the NVRAM by the memory controller and memory bus or other type of bus is smaller than that of the block size used by the flash memory and the access size of the I/O subsystem's controller and bus.

The NVRAM may be subject to the wear leveling operation due to the fact that storage cells thereof begin to wear out after a number of write operations. Since high cycle count blocks are most likely to wear out faster, the wear leveling operation may swap addresses between the high cycle count blocks and the low cycle count blocks to level out memory cell utilization. Most address swapping may be transparent to application programs because the swapping is handled by one or more of hardware and lower-level software (e.g., a low level driver or operating system).

The phase-change memory (PCM) or the phase change random access memory (PRAM or PCRAM) as an example of the NVRAM is a non-volatile memory using the chalcogenide glass. As a result of heat produced by the passage of an electric current, the chalcogenide glass can be switched between a crystalline state and an amorphous state. Recently the PRAM may have two additional distinct states. The PRAM may provide higher performance than the flash memory because a memory element of the PRAM can be switched more quickly, the write operation changing individual bits to either "1" or "0" can be done without the need to firstly erase an entire block of cells, and degradation caused by the write operation is slower. The PRAM device may survive approximately 100 million write cycles.

For example, the second memory 150 may be different from the SRAM, which may be employed for dedicated processor caches 113 respectively dedicated to the processor cores 111 and for a processor common cache 115 shared by the processor cores 111; the DRAM configured as one or more of the internal memory cache 131 internal to the processor 170 (e.g., on the same die as the processor 170) and the external memory cache 135 external to the processor 170 (e.g., in the same or a different package from the processor 170); the flash memory/magnetic disk/optical disc applied as the mass storage (not shown); and a memory (not shown) such as the flash memory or other read only memory (ROM) working as a firmware memory, which can refer to boot ROM and BIOS Flash.

The second memory 150 may work as instruction and data storage that is addressable by the processor 170 either directly or via the first memory 130. The second memory 150 may also keep pace with the processor 170 at least to a sufficient extent in contrast to a mass storage 251B. The second memory 150 may be placed on the memory bus, and may communicate directly with a memory controller and the processor 170.

The second memory 150 may be combined with other instruction and data storage technologies (e.g., DRAM) to form hybrid memories, such as, for example, the Co-locating PRAM and DRAM, the first level memory and the second level memory, and the FLAM (i.e., flash and DRAM).

At least a part of the second memory 150 may work as mass storage instead of, or in addition to, the system memory 151. When the second memory 150 serves as a mass storage 251A, the second memory 150 serving as the mass storage 251A need not be random accessible, byte addressable or directly addressable by the processor 170.

The first memory 130 may be an intermediate level of memory that has lower access latency relative to the second memory 150 and/or more symmetric access latency (i.e., having read operation times which are roughly equivalent to write operation times). For example, the first memory 130 may be a volatile memory such as volatile random access memory (VRAM) and may comprise the DRAM or other high speed capacitor-based memory. However, the underlying principles of the invention will not be limited to these specific memory types. The first memory 130 may have a relatively lower density. The first memory 130 may be more expensive to manufacture than the second memory 150.

In one embodiment, the first memory 130 may be provided between the second memory 150 and the processor cache 110. For example, the first memory 130 may be configured as one or more external memory caches 135 to mask the performance and/or usage limitations of the second memory 150 including, for example, read/write latency limitations and memory degradation limitations. The combination of the external memory cache 135 and the second memory 150 as the system memory 151 may operate at a performance level which approximates, is equivalent or exceeds a system which uses only the DRAM as the system memory 151.

The first memory 130 as the internal memory cache 131 may be located on the same die as the processor 170. The first memory 130 as the external memory cache 135 may be located external to the die of the processor 170. For example, the first memory 130 as the external memory cache 135 may be located on a separate die located on a CPU package, or located on a separate die outside the CPU package with a high bandwidth link to the CPU package. For example, the first memory 130 as the external memory cache 135 may be located on a dual in-line memory module (DIMM), a riser/mezzanine, or a computer motherboard. The first memory 130 may be coupled in communication with the processor 170 through a single or multiple high bandwidth links, such as the DDR or other transactional high bandwidth links.

FIG. 1 illustrates how various levels of caches 113, 115, 131 and 135 may be configured with respect to a system physical address (SPA) space in a system according to an embodiment of the present invention. As illustrated in FIG. 1, the processor 170 may include one or more processor cores 111, with each core having its own internal memory cache 131. Also, the processor 170 may include the processor common cache 115 shared by the processor cores 111. The operation of these various cache levels are well understood in the relevant art and will not be described in detail here.

For example, one of the external memory caches 135 may correspond to one of the system memories 151, and serve as the cache for the corresponding system memory 151. For example, some of the external memory caches 135 may correspond to one of the system memories 151, and serve as the caches for the corresponding system memory 151. In some embodiments, the caches 113, 115 and 131 provided within the processor 170 may perform caching operations for the entire SPA space.

The system memory 151 may be visible to and/or directly addressable by software executed on the processor 170. The cache memories 113, 115, 131 and 135 may operate transparently to the software in the sense that they do not form a directly-addressable portion of the SPA space while the processor cores 111 may support execution of instructions to allow software to provide some control (configuration, policies, hints, etc.) to some or all of the cache memories 113, 115, 131 and 135.

The subdivision into the plural system memories 151 may be performed manually as part of a system configuration process (e.g., by a system designer) and/or may be performed automatically by software.

In one embodiment, the system memory 151 may be implemented with one or more of the non-volatile memory (e.g., PRAM) used as the second memory 150, and the volatile memory (e.g., DRAM) used as the first memory 130. The system memory 151 implemented with the volatile memory may be directly addressable by the processor 170 without the first memory 130 serving as the memory caches 131 and 135.

FIG. 2 illustrates the hierarchy of cache-system memory-mass storage by the first and second memories 130 and 150 and various possible operation modes for the first and second memories 130 and 150.

The hierarchy of cache-system memory-mass storage may comprise a cache level 210, a system memory level 230 and a mass storage level 250, and additionally comprise a firmware memory level (not illustrated).

The cache level 210 may include the dedicated processor caches 113 and the processor common cache 115, which are the processor cache. Additionally, when the first memory 130 serves in a cache mode for the second memory 150 working as the system memory 151B, the cache level 210 may further include the internal memory cache 131 and the external memory cache 135.

The system memory level 230 may include the system memory 151B implemented with the second memory 150. Additionally, when the first memory 130 serves in a system memory mode, the system memory level 230 may further include the first memory 130 working as the system memory 151A.

The mass storage level 250 may include one or more of the flash/magnetic/optical mass storage 251B and the mass storage 215A implemented with the second memory 150.

Further, the firmware memory level may include the BIOS flash (not illustrated) and the BIOS memory implemented with the second memory 150.

The first memory 130 may serve as the caches 131 and 135 for the second memory 150 working as the system memory 151B in the cache mode. Further, the first memory 130 may serve as the system memory 151A and occupy a portion of the SPA space in the system memory mode.

The first memory 130 may be partitionable, wherein each partition may independently operate in a different one of the cache mode and the system memory mode. Each partition may alternately operate between the cache mode and the system memory mode. The partitions and the corresponding modes may be supported by one or more of hardware, firmware, and software. For example, sizes of the partitions and the corresponding modes may be supported by a set of programmable range registers capable of identifying each partition and each mode within a memory cache controller 270.

When the first memory 130 serves in the cache mode for the system memory 151B, the SPA space may be allocated not to the first memory 130 working as the memory caches 131 and 135 but to the second memory 150 working as the system memory 151B. When the first memory 130 serves in the system memory mode, the SPA space may be allocated to the first memory 130 working as the system memory 151A and the second memory 150 working as the system memory 151B.

When the first memory 130 serves in the cache mode for the system memory 151B, the first memory 130 working as the memory caches 131 and 135 may operate in various sub-modes under the control of the memory cache controller 270. In each of the sub-modes, a memory space of the first memory 130 may be transparent to software in the sense that the first memory 130 does not form a directly-addressable portion of the SPA space. When the first memory 130 serves in the cache mode, the sub-modes may include but may not be limited as of the following table 1.

TABLE 1

| MODE | READ OPERATION | WRITE OPERATION |
|---|---|---|
| Write-Back Cache | Allocate on Cache Miss Write-Back on Evict of Dirty Data | Allocate on Cache Miss Write-Back on Evict of Dirty Data |
| $1^{st}$ Memory Bypass | Bypass to $2^{nd}$ Memory | Bypass to $2^{nd}$ Memory |
| $1^{st}$ Memory Read-Cache & Write-Bypass | Allocate on Cache Miss | Bypass to $2^{nd}$ Memory Cache Line Invalidation |
| $1^{st}$ Memory Read-Cache & Write-Through | Allocate on Cache Miss | Update Only on Cache Hit Write-Through to $2^{nd}$ Memory |

During the write-back cache mode, part of the first memory 130 may work as the caches 131 and 135 for the second memory 150 working as the system memory 151B. During the write-back cache mode, every write operation is directed initially to the first memory 130 working as the memory caches 131 and 135 when a cache line, to which the write operation is directed, is present in the caches 131 and 135. A corresponding write operation is performed to update the second memory 150 working as the system memory 151B only when the cache line within the first memory 130 working as the memory caches 131 and 135 is to be replaced by another cache line.

During the first memory bypass mode, all read and write operations bypass the first memory 130 working as the memory caches 131 and 135 and are performed directly to the second memory 150 working as the system memory 151B. For example, the first memory bypass mode may be activated when an application is not cache-friendly or requires data to be processed at the granularity of a cache line. In one embodiment, the processor caches 113 and 115 and the first memory 130 working as the memory caches 131 and 135 may perform the caching operation independently from each other. Consequently, the first memory 130 working as the memory caches 131 and 135 may cache data, which is not cached or required not to be cached in the processor caches 113 and 115, and vice versa. Thus, certain data required not to be cached in the processor caches 113 and 115 may be cached within the first memory 130 working as the memory caches 131 and 135.

During the first memory read-cache and write-bypass mode, a read caching operation to data from the second memory 150 working as the system memory 151B may be allowed. The data of the second memory 150 working as the system memory 151B may be cached in the first memory 130 working as the memory caches 131 and 135 for read-only operations. The first memory read-cache and write-bypass mode may be useful in the case that most data of the second memory 150 working as the system memory 151B is "read only" and the application usage is cache-friendly.

The first memory read-cache and write-through mode may be considered as a variation of the first memory read-cache and write-bypass mode. During the first memory read-cache and write-through mode, the write-hit may also be cached as well as the read caching. Every write operation to the first memory 130 working as the memory caches 131 and 135 may cause a write operation to the second memory 150 working as the system memory 151B. Thus, due to the write-through nature of the cache, cache-line persistence may be still guaranteed.

When the first memory 130 works as the system memory 151A, all or parts of the first memory 130 working as the system memory 151A may be directly visible to an application and may form part of the SPA space. The first memory 130 working as the system memory 151A may be completely under the control of the application. Such scheme may create the non-uniform memory address (NUMA) memory domain where an application gets higher performance from the first memory 130 working as the system memory 151A relative to the second memory 150 working as the system memory 151B. For example, the first memory 130 working as the system memory 151A may be used for the high performance computing (HPC) and graphics applications which require very fast access to certain data structures.

In an alternative embodiment, the system memory mode of the first memory 130 may be implemented by pinning certain cache lines in the first memory 130 working as the system memory 151A, wherein the cache lines have data also concurrently stored in the second memory 150 working as the system memory 151B.

Although not illustrated, parts of the second memory 150 may be used as the firmware memory. For example, the parts of the second memory 150 may be used to store BIOS images instead of or in addition to storing the BIOS information in the BIOS flash. In this case, the parts of the second memory 150 working as the firmware memory may be a part of the SPA space and may be directly addressable by an application executed on the processor cores 111 while the BIOS flash may be addressable through an I/O sub-system 320.

To sum up, the second memory 150 may serve as one or more of the mass storage 215A and the system memory 151B. When the second memory 150 serves as the system memory 151B and the first memory 130 serves as the system memory 151A, the second memory 150 working as the system memory 151B may be coupled directly to the processor caches 113 and 115. When the second memory 150 serves as the system memory 151B but the first memory 130 serves as the cache memories 131 and 135, the second memory 150 working as the system memory 151B may be coupled to the processor caches 113 and 115 through the first memory 130 working as the memory caches 131 and 135. Also, the second memory 150 may serve as the firmware memory for storing the BIOS images.

Figure 3:
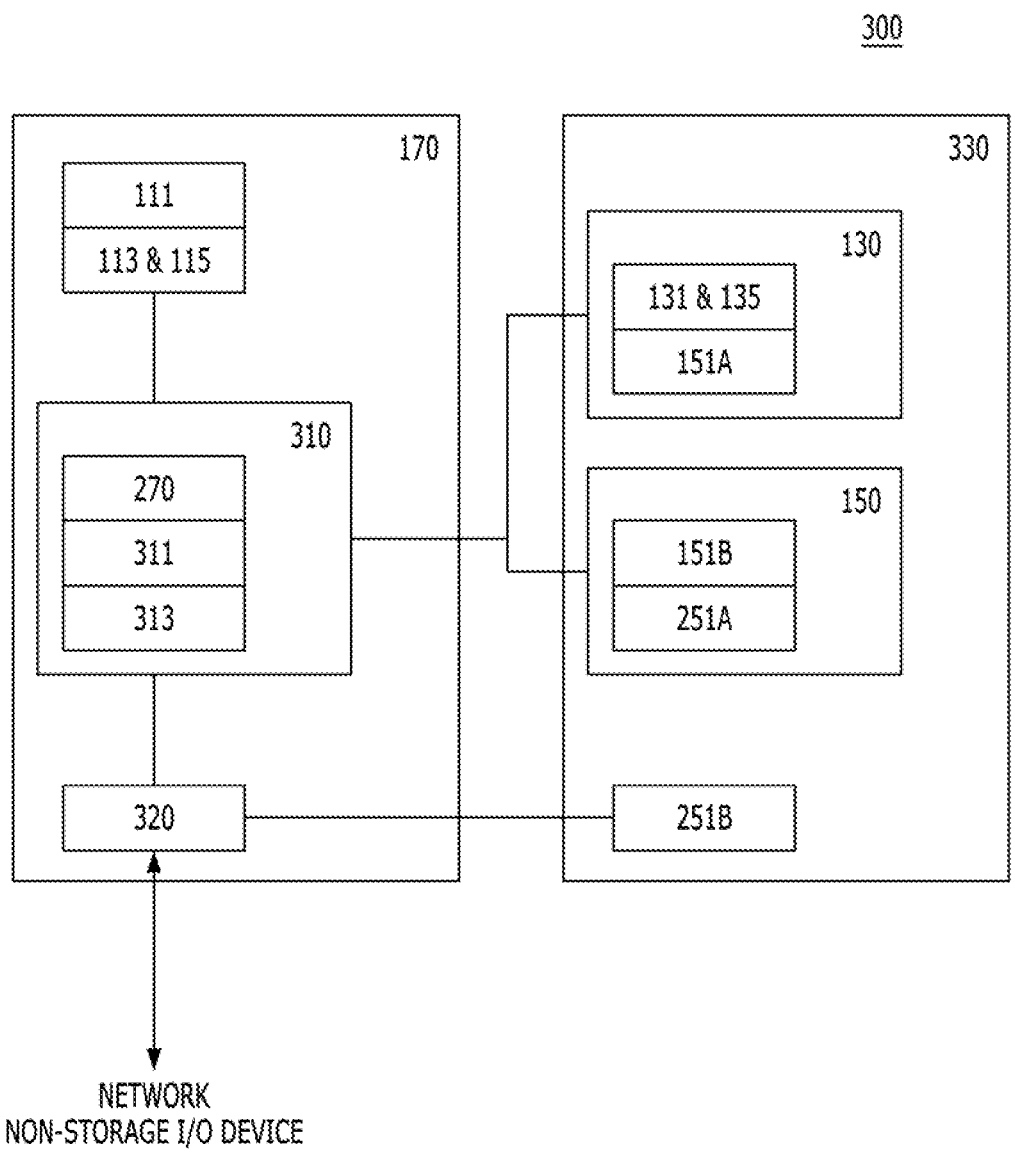
FIG. 3 is a block diagram illustrating a computer system according to an embodiment of the present invention.

FIG. 3 is a block diagram illustrating a computer system 300 according to an embodiment of the present invention.

The computer system 300 may include the processor 170 and a memory and storage sub-system 330.

The memory and storage sub-system 330 may include the first memory 130, the second memory 150, and the flash/magnetic/optical mass storage 251B. The first memory 130 may include one or more of the cache memories 131 and 135 working in the cache mode and the system memory 151A working in the system memory mode. The second memory 150 may include the system memory 151B, and may further include the mass storage 251A as an option.

In one embodiment, the NVRAM may be adopted to configure the second memory 150 including the system memory 151B, and the mass storage 251A for the computer system 300 for storing data, instructions, states, and other persistent and non-persistent information.

Referring to FIG. 3, the second memory 150 may be partitioned into the system memory 151B and the mass storage 251A, and additionally the firmware memory as an option.

For example, the first memory 130 working as the memory caches 131 and 135 may operate as follows during the write-back cache mode.

The memory cache controller 270 may perform the look-up operation in order to determine whether the read-requested data is cached in the first memory 130 working as the memory caches 131 and 135.

When the read-requested data is cached in the first memory 130 working as the memory caches 131 and 135, the memory cache controller 270 may return the read-requested data from the first memory 130 working as the memory caches 131 and 135 to a read requestor (e.g., the processor cores 111).

When the read-requested data is not cached in the first memory 130 working as the memory caches 131 and 135, the memory cache controller 270 may provide a second memory controller 311 with the data read request and a system memory address. The second memory controller 311 may use a decode table 313 to translate the system memory address to a physical device address (PDA) of the second memory 150 working as the system memory 151B, and may direct the read operation to the corresponding region of the second memory 150 working as the system memory 151B. In one embodiment, the decode table 313 may be used for the second memory controller 311 to translate the system memory address to the PDA of the second memory 150 working as the system memory 151B, and may be updated as part of the wear leveling operation to the second memory 150 working as the system memory 151B. Alternatively, a part of the decode table 313 may be stored within the second memory controller 311.

Upon receiving the requested data from the second memory 150 working as the system memory 151B, the second memory controller 311 may return the requested data to the memory cache controller 270, the memory cache controller 270 may store the returned data in the first memory 130 working as the memory caches 131 and 135 and may also provide the returned data to the read requestor. Subsequent requests for the returned data may be handled directly from the first memory 130 working as the memory caches 131 and 135 until the returned data is replaced by another data provided from the second memory 150 working as the system memory 151B.

During the write-back cache mode when the first memory 130 works as the memory caches 131 and 135, the memory cache controller 270 may perform the look-up operation in order to determine whether the write-requested data is cached in the first memory 130 working as the memory caches 131 and 135. During the write-back cache mode, the write-requested data may not be provided directly to the second memory 150 working as the system memory 151B. For example, the previously write-requested and currently cached data may be provided to the second memory 150 working as the system memory 151B only when the location of the previously write-requested data currently cached in first memory 130 working as the memory caches 131 and 135 should be re-used for caching another data corresponding to a different system memory address. In this case, the memory cache controller 270 may determine that the previously write-requested data currently cached in the first memory 130 working as the memory caches 131 and 135 is currently not in the second memory 150 working as the system memory 151B, and thus may retrieve the currently cached data from first memory 130 working as the memory caches 131 and 135 and provide the retrieved data to the second memory controller 311. The second memory controller 311 may look up the PDA of the second memory 150 working as the system memory 151B for the system memory address, and then may store the retrieved data into the second memory 150 working as the system memory 151B.

The coupling relationship among the second memory controller 311 and the first and second memories 130 and 150 of FIG. 3 may not necessarily indicate particular physical bus or particular communication channel. In some embodiments, a common memory bus or other type of bus may be used to communicatively couple the second memory controller 311 to the second memory 150. For example, in one embodiment, the coupling relationship between the second memory controller 311 and the second memory 150 of FIG. 3 may represent the DDR-typed bus, over which the second memory controller 311 communicates with the second memory 150. The second memory controller 311 may also communicate with the second memory 150 over a bus supporting a native transactional protocol such as the PCIE bus, the DMI bus, or any other type of bus utilizing a transactional protocol and a small-enough transaction payload size (e.g., cache line size such as 64 or 128 bytes).

In one embodiment, the computer system 300 may include an integrated memory controller 310 suitable for performing a central memory access control for the processor 170. The integrated memory controller 310 may include the memory cache controller 270 suitable for performing a memory access control to the first memory 130 working as the memory caches 131 and 135, and the second memory controller 311 suitable for performing a memory access control to the second memory 150.

In the illustrated embodiment, the memory cache controller 270 may include a set of mode setting information which specifies various operation mode (e.g., the write-back cache mode, the first memory bypass mode, etc.) of the first memory 130 working as the memory caches 131 and 135 for the second memory 150 working as the system memory 151B. In response to a memory access request, the memory cache controller 270 may determine whether the memory access request may be handled from the first memory 130 working as the memory caches 131 and 135 or whether the memory access request is to be provided to the second memory controller 311, which may then handle the memory access request from the second memory 150 working as the system memory 151B.

In an embodiment where the second memory 150 is implemented with PRAM, the second memory controller 311 may be a PRAM controller. Despite that the PRAM is inherently capable of being accessed at the granularity of bytes, the second memory controller 311 may access the PRAM-based second memory 150 at a lower level of granularity such as a cache line (e.g., a 64-bit or 128-bit cache line) or any other level of granularity consistent with the memory sub-system. When PRAM-based second memory 150 is used to form a part of the SPA space, the level of granularity may be higher than that traditionally used for other non-volatile storage technologies such as the flash memory, which may only perform the rewrite and erase operations at the level of a block (e.g., 64 Kbytes in size for the NOR flash memory and 16 Kbytes for the NAND flash memory).

In the illustrated embodiment, the second memory controller 311 may read configuration data from the decode table 313 in order to establish the above described partitioning and modes for the second memory 150. For example, the computer system 300 may program the decode table 313 to partition the second memory 150 into the system memory 151B and the mass storage 251A. An access means may access different partitions of the second memory 150 through the decode table 313. For example, an address range of each partition is defined in the decode table 333.

In one embodiment, when the integrated memory controller 310 receives an access request, a target address of the access request may be decoded to determine whether the request is directed toward the system memory 151B, the mass storage 251A, or I/O devices.

When the access request is a memory access request, the memory cache controller 270 may further determine from the target address whether the memory access request is directed to the first memory 130 working as the memory caches 131 and 135 or to the second memory 150 working as the system memory 151B. For the access to the second memory 150 working as the system memory 151B, the memory access request may be forwarded to the second memory controller 311.

The integrated memory controller 310 may pass the access request to the I/O sub-system 320 when the access request is directed to the I/O device. The I/O sub-system 320 may further decode the target address to determine whether the target address points to the mass storage 251A of the second memory 150, the firmware memory of the second memory 150, or other non-storage or storage I/O devices. When the further decoded address points to the mass storage 251A or the firmware memory of the second memory 150, the I/O sub-system 320 may forward the access request to the second memory controller 311.

The second memory 150 may act as replacement or supplement for the traditional DRAM technology in the system memory. In one embodiment, the second memory 150 working as the system memory 151B along with the first memory 130 working as the memory caches 131 and 135 may represent a two-level system memory. For example, the two-level system memory may include a first-level system memory comprising the first memory 130 working as the memory caches 131 and 135 and a second-level system memory comprising the second memory 150 working as the system memory 151B.

According to some embodiments, the mass storage 251A implemented with the second memory 150 may act as replacement or supplement for the flash/magnetic/optical mass storage 251B. In some embodiments, even though the second memory 150 is capable of byte-level addressability, the second memory controller 311 may still access the mass storage 251A implemented with the second memory 150 by units of blocks of multiple bytes (e.g., 64 Kbytes, 128 Kbytes, and so forth). The access to the mass storage 251A implemented with the second memory 150 by the second memory controller 311 may be transparent to an application executed by the processor 170. For example, even though the mass storage 251A implemented with the second memory 150 is accessed differently from the flash/magnetic/optical mass storage 251B, the operating system may still treat the mass storage 251A implemented with the second memory 150 as a standard mass storage device (e.g., a serial ATA hard drive or other standard form of mass storage device).

In an embodiment where the mass storage 251A implemented with the second memory 150 acts as replacement or supplement for the flash/magnetic/optical mass storage 251B, it may not be necessary to use storage drivers for block-addressable storage access. The removal of the storage driver overhead from the storage access may increase access speed and may save power. In alternative embodiments where the mass storage 251A implemented with the second memory 150 appears as block-accessible to the OS and/or applications and indistinguishable from the flash/magnetic/optical mass storage 251B, block-accessible interfaces (e.g., Universal Serial Bus (USB), Serial Advanced Technology Attachment (SATA) and the like) may be exposed to the software through emulated storage drivers in order to access the mass storage 251A implemented with the second memory 150.

In some embodiments, the processor 170 may include the integrated memory controller 310 comprising the memory cache controller 270 and the second memory controller 311, all of which may be provided on the same chip as the processor 170, or on a separate chip and/or package connected to the processor 170.

In some embodiments, the processor 170 may include the I/O sub-system 320 coupled to the integrated memory controller 310. The I/O sub-system 320 may enable communication between processor 170 and one or more of networks such as the local area network (LAN), the wide area network (WAN) or the internet; a storage I/O device such as the flash/magnetic/optical mass storage 251B and the BIOS flash; and one or more of non-storage I/O devices such as display, keyboard, speaker, and the like. The I/O sub-system 320 may be on the same chip as the processor 170, or on a separate chip and/or package connected to the processor 170.

The I/O sub-system 320 may translate a host communication protocol utilized within the processor 170 to a protocol compatible with particular I/O devices.

In the particular embodiment of FIG. 3, the memory cache controller 270 and the second memory controller 311 may be located on the same die or package as the processor 170. In other embodiments, one or more of the memory cache controller 270 and the second memory controller 311 may be located off-die or off-package, and may be coupled to the processor 170 or the package over a bus such as a memory bus such as the DDR bus, the PCIE bus, the DMI bus, or any other type of bus.

Figure 4:
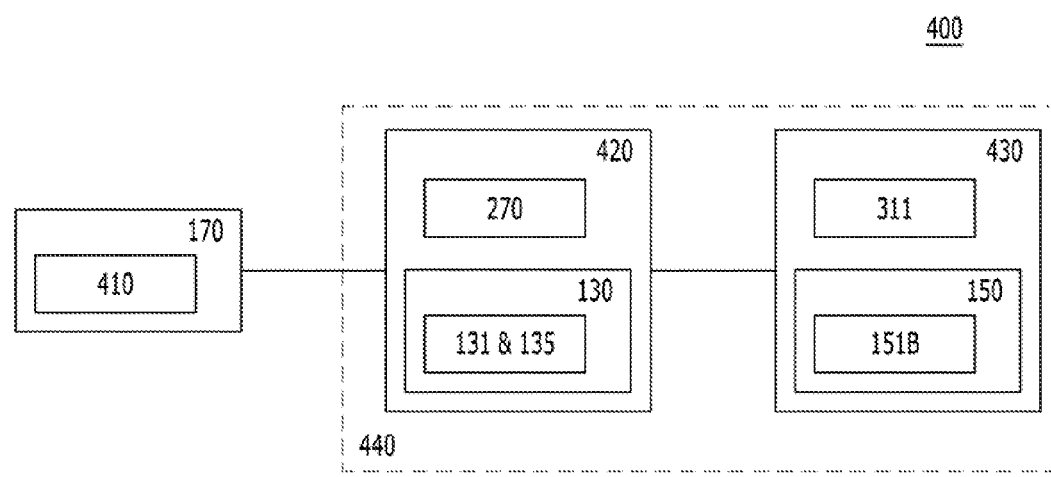
FIG. 4 is a block diagram illustrating a memory system according to an embodiment of the present invention.

FIG. 4 is a block diagram illustrating a memory system 400 according to an embodiment of the present invention.

Referring to FIG. 4, the memory system 400 may include the processor 170 and a two-level memory sub-system 440. The two-level memory sub-system 440 may be communicatively coupled to the processor 170, and may include a first memory unit 420 and a second memory unit 430 serially coupled to each other. The first memory unit 420 may include the memory cache controller 270 and the first memory 130 working as the memory caches 131 and 135. The second memory unit 430 may include the second memory controller 311 and the second memory 150 working as the system memory 151B. The two-level memory sub-system 440 may include cached sub-set of the mass storage level 250 including run-time data. In an embodiment, the first memory 130 included in the two-level memory sub-system 440 may be volatile and the DRAM. In an embodiment, the second memory 150 included in the two-level memory sub-system 440 may be non-volatile and one or more of the NAND flash memory, the NOR flash memory and the NVRAM. Even though the second memory 150 may be exemplarily implemented with the NVRAM, the second memory 150 will not be limited to a particular memory technology.

The second memory 150 may be presented as the system memory 151B to a host operating system (OS: not illustrated) while the first memory 130 works as the caches 131 and 135, which is transparent to the OS, for the second memory 150 working as the system memory 151B. The two-level memory sub-system 440 may be managed by a combination of logic and modules executed via the processor 170. In an embodiment, the first memory 130 may be coupled to the processor 170 through high bandwidth and low latency means for efficient processing. The second memory 150 may be coupled to the processor 170 through low bandwidth and high latency means.

The two-level memory sub-system 440 may provide the processor 170 with run-time data storage and access to the contents of the mass storage level 250. The processor 170 may include the processor caches 113 and 115, which store a subset of the contents of the two-level memory sub-system 440.

The first memory 130 may be managed by the memory cache controller 270 while the second memory 150 may be managed by the second memory controller 311. Even though FIG. 4 exemplifies the two-level memory sub-system 440, in which the memory cache controller 270 and the first memory 130 are included in the first memory unit 420 and the second memory controller 311 and the second memory 150 are included in the second memory unit 430, the first and second memory units 420 and 430 may be physically located on the same die or package as the processor 170; or may be physically located off-die or off-package, and may be coupled to the processor 170. Further, the memory cache controller 270 and the first memory 130 may be located on the same die or package or on the different dies or packages. Also, the second memory controller 311 and the second memory 150 may be located on the same die or package or on the different dies or packages. In an embodiment, the memory cache controller 270 and the second memory controller 311 may be located on the same die or package as the processor 170. In other embodiments, one or more of the memory cache controller 270 and the second memory controller 311 may be located off-die or off-package, and may be coupled to the processor 170 or to the package over a bus such as a memory bus (e.g., the DDR bus), the PCIE bus, the DMI bus, or any other type of bus.

The second memory controller 311 may report the second memory 150 to the system OS as the system memory 151B. Therefore, the system OS may recognize the size of the second memory 150 as the size of the two-level memory sub-system 440. The system OS and system applications are unaware of the first memory 130 since the first memory 130 serves as the transparent caches 131 and 135 for the second memory 150 working as the system memory 151B.

The processor 170 may further include a two-level management unit 410. The two-level management unit 410 may be a logical construct that may comprise one or more of hardware and micro-code extensions to support the two-level memory sub-system 440. For example, the two-level management unit 410 may maintain a full tag table that tracks the status of the second memory 150 working as the system memory 151B. For example, when the processor 170 attempts to access a specific data segment in the two-level memory sub-system 440, the two-level management unit 410 may determine whether the data segment is cached in the first memory 130 working as the caches 131 and 135. When the data segment is not cached in the first memory 130, the two-level management unit 410 may fetch the data segment from the second memory 150 working as the system memory 151B and subsequently may write the fetched data segment to the first memory 130 working as the caches 131 and 135. Because the first memory 130 works as the caches 131 and 135 for the second memory 150 working as the system memory 151B, the two-level management unit 410 may further execute data prefetching or similar cache efficiency processes known in the art.

The two-level management unit 410 may manage the second memory 150 working as the system memory 151B. For example, when the second memory 150 comprises the non-volatile memory, the two-level management unit 410 may perform various operations including wear-levelling, bad-block avoidance, and the like in a manner transparent to the system software.

As an exemplified process of the two-level memory sub-system 440, in response to a request for a data operand, it may be determined whether the data operand is cached in first memory 130 working as the memory caches 131 and 135. When the data operand is cached in first memory 130 working as the memory caches 131 and 135, the operand may be returned from the first memory 130 working as the memory caches 131 and 135 to a requestor of the data operand. When the data operand is not cached in first memory 130 working as the memory caches 131 and 135, it may be determined whether the data operand is stored in the second memory 150 working as the system memory 151B. When the data operand is stored in the second memory 150 working as the system memory 151B, the data operand may be cached from the second memory 150 working as the system memory 151B into the first memory 130 working as the memory caches 131 and 135 and then returned to the requestor of the data operand. When the data operand is not stored in the second memory 150 working as the system memory 151B, the data operand may be retrieved from the mass storage 250, cached into the second memory 150 working as the system memory 151B, cached into the first memory 130 working as the memory caches 131 and 135, and then returned to the requestor of the data operand.

In accordance with an embodiment of the present invention, the processor 170 and the second memory unit 430 may communicate each other through routing of the first memory unit 420. The processor 170 and the first memory unit 420 may communicate with each other through well-known protocol. Further, signals exchanged between the processor 170 and the first memory unit 420 and signals exchanged between the processor 170 and the second memory unit 430 via the first memory unit 420 may include a memory selection information field and a handshaking information field as well as a memory access request field and a corresponding response field (e.g., the read command, the write command, the address, the data and the data strobe).

The memory selection information field may indicate destination of the signals provided from the processor 170 and source of the signals provided to the processor 170 between the first and second memory units 420 and 430.

In an embodiment, when the two-level memory sub-system 440 includes two memory units of the first and second memory units 420 and 430, the memory selection information field may have one-bit information. For example, when the memory selection information field have a value representing a first state (e.g., logic low state), the corresponding memory access request may be directed to the first memory unit 420. When the memory selection information field have a value representing a second state (e.g., logic high state), the corresponding memory access request may be directed to the second memory unit 430. In another embodiment, when the two-level memory sub-system 440 includes three or more of memory units, the memory selection information field may have information of two or more bits in order to relate the corresponding signal with one as the destination among the three or more memory units communicatively coupled to the processor 170.

In an embodiment, when the two-level memory sub-system 440 includes two memory units of the first and second memory units 420 and 430, the memory selection information field may include two-bit information. The two-bit information may indicate the source and the destination of the signals among the processor 170 and the first and second memory units 420 and 430. For example, when the memory selection information field has a value (e.g., binary value "00") representing a first state, the corresponding signal may be the memory access request directed from the processor 170 to the first memory unit 420. When the memory selection information field has a value (e.g., binary value "01") representing a second state, the corresponding signal may be the memory access request directed from the processor 170 to the second memory unit 430. When the memory selection information field has a value (e.g., binary value "10") representing a third state, the corresponding signal may be the memory access response directed from the first memory unit 420 to the processor 170. When the memory selection information field has a value (e.g., binary value "11") representing a fourth state, the corresponding signal may be the memory access response directed from the second memory unit 430 to the processor 170. In another embodiment, when the two-level memory sub-system 440 includes "N" number of memory units ("N" is greater than 2), the memory selection information field may include information of 2N bits in order to indicate the source and the destination of the corresponding signal among the "N" number of memory units communicatively coupled to the processor 170.

The memory cache controller 270 of the first memory unit 420 may identify one of the first and second memory units 420 and 430 as the destination of the signal provided from the processor 170 based on the value of the memory selection information field. Further, the memory cache controller 270 of the first memory unit 420 may provide the processor 170 with the signals from the first memory 130 working as the memory caches 131 and 135 and the second memory 150 working as the system memory 151B by generating the value of the memory selection information field according to the source of the signal between the first and second memory units 420 and 430. Therefore, the processor 170 may identify the source of the signal, which is directed to the processor 170, between the first and second memory units 420 and 430 based on the value of the memory selection information field.

The handshaking information field may be for the second memory unit 430 communicating with the processor 170 through the handshaking scheme, and therefore may be included in the signal exchanged between the processor 170 and the second memory unit 430. The handshaking information field may have three values according to types of the signal between the processor 170 and the second memory unit 430 as exemplified in the following table 2.

TABLE 2

| HAND-SHAKING FIELD | SOURCE | DESTINATION | SIGNAL TYPE |
|---|---|---|---|
| 10 | PROCESSOR (170) | $2^{ND}$ MEMORY UNIT (430) | DATA REQUEST (READ COMMAND) |
| 11 | $2^{ND}$ MEMORY UNIT (430) | PROCESSOR (170) | DATA READY |
| 01 | PROCESSOR (170) | $2^{ND}$ MEMORY UNIT (430) | SESSION START |

As exemplified in table 2, the signals between the processor 170 and the second memory unit 430 may include at least the data request signal ("DATA REQUEST (READ COMMAND)"), the data ready signal ("DATA READY"), and the session start signal ("SESSION START"), which have binary values "10", "11" and "01" of the handshaking information field, respectively.

The data request signal may be provided from the processor 170 to the second memory unit 430, and may indicate a request of data stored in the second memory unit 430. Therefore, for example, the data request signal may include the read command and the read address as well as the handshaking information field having the value "10" indicating the second memory unit 430 as the destination.

The data ready signal may be provided from the second memory unit 430 to the processor 170 in response to the data request signal, and may have the handshaking information field of the value "11" representing transmission standby of the requested data, which is retrieved from the second memory unit 430 in response to the read command and the read address included in the data request signal.

The session start signal may be provided from the processor 170 to the second memory unit 430 in response to the data ready signal, and may have the handshaking information field of the value "01" representing reception start of the requested data ready to be transmitted in the second memory unit 430. For example, the processor 170 may receive the requested data from the second memory unit 430 after providing the session start signal to the second memory unit 430.

The processor 170 and the second memory controller 311 of the second memory unit 430 may operate according to the signals between the processor 170 and the second memory unit 430 by identifying the type of the signals based on the value of the handshaking information field.

Although not illustrated, the second memory unit 430 may further include a handshaking interface unit. The handshaking interface unit may receive the data request signal provided from the processor 170 and having the value "10" of the handshaking information field, and allow the second memory unit 430 to operate according to the data request signal. Also, the handshaking interface unit may provide the processor 170 with the data ready signal having the value "01" of the handshaking information field in response to the data request signal from the processor 170.

Although not illustrated, the second memory unit 430 may further include a register. The register may temporarily store the requested data retrieved from the second memory 150 working as the system memory 151B in response to the data request signal from the processor 170. The second memory unit 430 may temporarily store the requested data retrieved from the second memory 150 working as the system memory 151B into the register and then provide the processor 170 with the data ready signal having the value "01" of the handshaking information field in response to the data request signal.

Further, in accordance with an embodiment of the present invention, in the memory system 400 including the processor 170 and the two-level memory sub-system 440, which is coupled to the processor 170 and has the first memory unit 420 and the second memory unit 430, when the first memory 130 working as the memory caches 131 and 135 and the second memory 150 working as the system memory 151B have different latencies (e.g., when a second latency latency_F of the second memory 150 working as the system memory 151B is greater than a first latency latency_N of the first memory 130 working as the memory caches 131 and 135), the processor 170 may operate with the first memory 130 working as the memory caches 131 and 135 during the second latency latency_F thereby improving the overall data transmission rate.

Figure 5A:
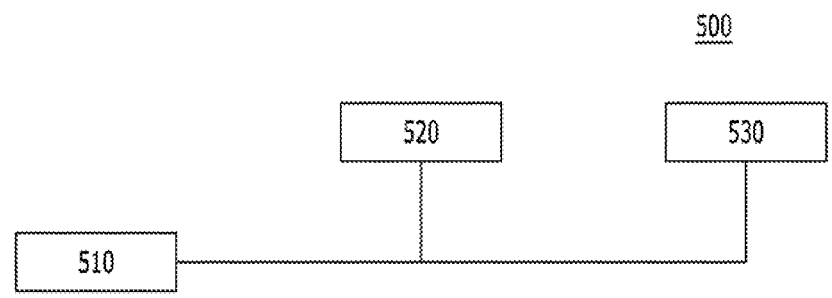
FIG. 5A is a block diagram illustrating a memory system according to a comparative example.
Figure 5B:
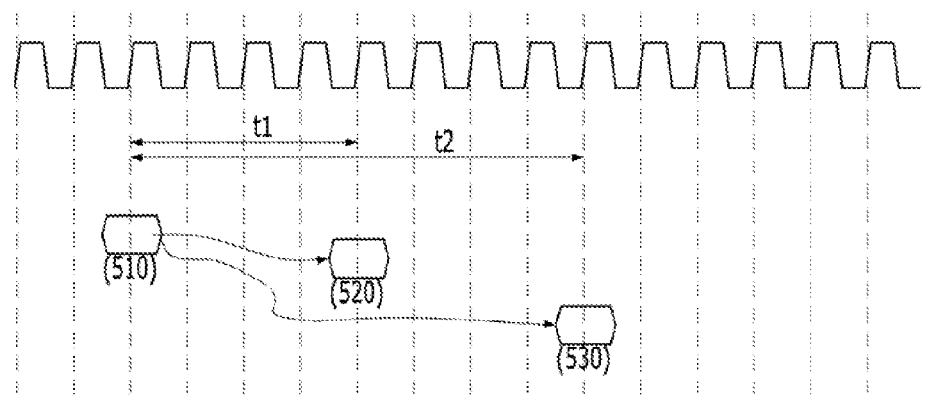
FIG. 5B is a timing diagram illustrating a latency example of the memory system of FIG. 5A.

FIG. 5A is a block diagram illustrating a memory system 500 according to a comparative example. FIG. 5B is a timing diagram illustrating a latency example of the memory system 500 of FIG. 5A.

The memory system 500 includes a processor 510, a first memory unit 520 and a second memory unit 530. The processor 510, the first memory unit 520 and the second memory unit 530 are communicatively coupled to one another through a common bus. For example, the first memory unit 520 corresponds to both of the memory cache controller 270 and the first memory 130 working as the memory caches 131 and 135. For example, the second memory unit 530 corresponds to both of the second memory controller 311 and the second memory 150 working as the system memory 151B. For example, the processor 510 directly accesses the first memory unit 520 and the second memory unit 530 through the memory cache controller 270 and the second memory controller 311. For example, the first memory 130 working as the memory caches 131 and 135 in the first memory unit 520 and the second memory 150 working as the system memory 151B in the second memory unit 530 have different latencies.

Therefore, as exemplified in FIG. 5B, a read data is transmitted from the first memory unit 520 to the processor 510 "t1" after the processor 510 provides the read command to the first memory unit 520. Also as exemplified in FIG. 5B, a read data is transmitted from the second memory unit 530 to the processor 510 "t2" after the processor 510 provides the read command to the second memory unit 530. The latency (represented as "t2" in FIG. 5B) of the second memory unit 530 is greater than the latency (represented as "t1" in FIG. 5B) of the first memory unit 520.

When the first memory unit 520 and the second memory unit 530 have different latencies in the memory system 500 where the processor 510 and the first and second memory units 520 and 530 are coupled to one another through the common bus, the data transmission rate between the processor 510 and the first and second memory units 520 and 530 is low. For example, when data transmission between the processor 510 and the first memory unit 520 is performed two times and the data transmission between the processor 510 and the second memory unit 530 is performed two times, it takes 2*(t1+t2) for all of the data transmissions. When "t2" is double of "t1", it takes 6t1 for all of the data transmissions.

Figure 6A:
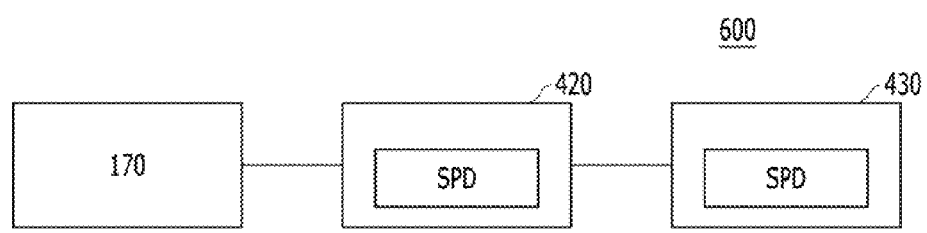
FIG. 6A is a block diagram illustrating a memory system according to an embodiment of the present invention.
Figure 6B:
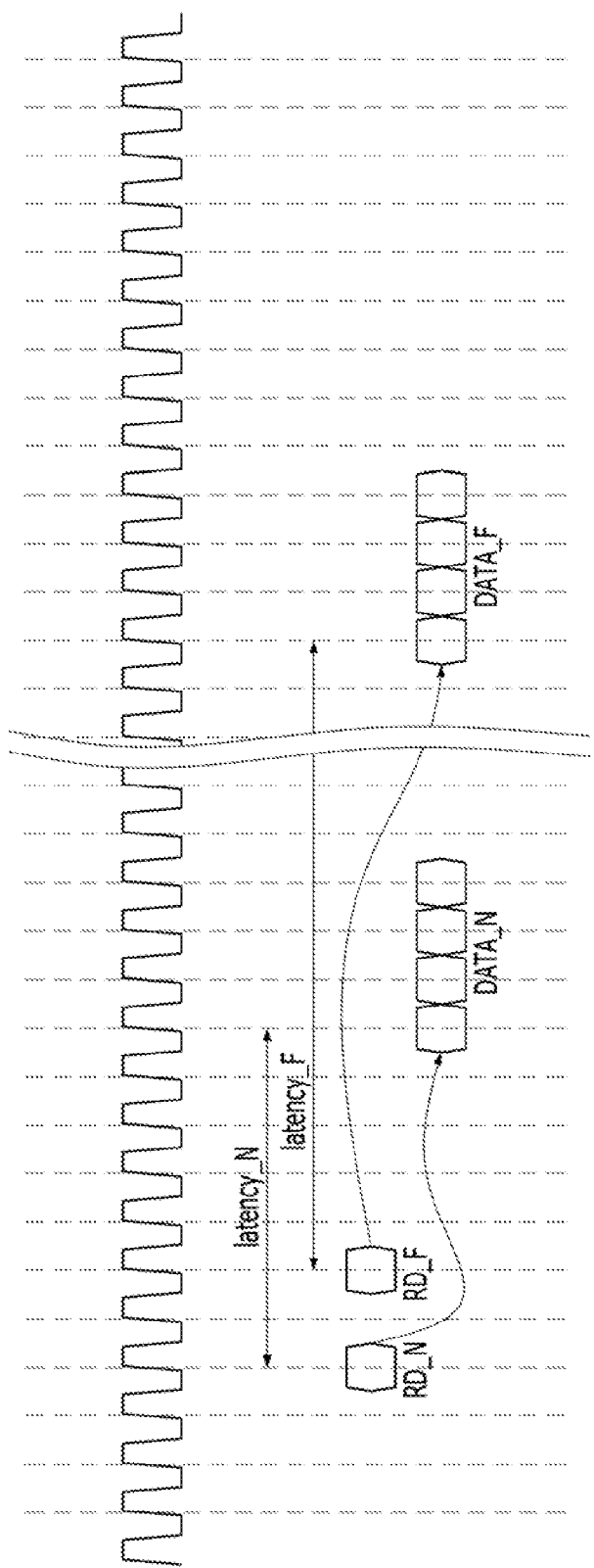
FIG. 6B is a timing diagram illustrating a latency example of the memory system of FIG. 6A.

FIG. 6A is a block diagram illustrating a memory system 600 according to an embodiment of the present invention. FIG. 6B is a timing diagram illustrating a latency example of the memory system 600 of FIG. 6A. FIG. 6A especially emphasizes memory information storage units SPDs included in the memory system 400 described with reference to FIG. 4.

In accordance with an embodiment of the present invention, the memory system 400 may include the processor 170 and the two-level memory sub-system 440. The two-level memory sub-system 440 may be communicatively coupled to the processor 170, and include the first and second memory units 420 and 430 serially coupled to each other. The first memory unit 420 may include the memory cache controller 270 and the first memory 130 working as the memory caches 131 and 135. The second memory unit 430 may include the second memory controller 311 and the second memory 150 working as the system memory 151B. In an embodiment of the two-level memory sub-system 440, the first memory 130 working as the memory caches 131 and 135 may be volatile such as the DARM, and the second memory 150 working as the system memory 151B may be non-volatile such as one or more of the NAND flash, the NOR flash and the NVRAM. For example, the second memory 150 working as the system memory 151B may be implemented with the NVRAM, which will not limit the present invention. The processor 170 may directly access each of the first and second memory units 420 and 430. The first memory 130 working as the memory caches 131 and 135 in the first memory unit 420 may have different latency from the second memory 150 working as the system memory 151B in the second memory unit 430. FIG. 6A exemplifies two memory units (the first and second memory units 420 and 430), which may vary according to system design.

For example, as exemplified in FIG. 6B, a read data DATA_N may be transmitted from the first memory unit 420 to the processor 170 a time corresponding to a first latency latency_N after the processor 170 provides the read command RD_N to the first memory unit 420. Also as exemplified in FIG. 6B, a read data DATA_F may be transmitted from the second memory unit 430 to the processor 170 a predetermined time corresponding to a second latency latency_F after the processor 170 provides the read command RD_F to the second memory unit 430. The first memory 130 working as the memory caches 131 and 135 in the first memory unit 420 may have different latency from the second memory 150 working as the system memory 151B in the second memory unit 430. For example, the second latency latency_F of the second memory unit 430 may be greater than the first latency latency_N of the first memory unit 420.

In accordance with an embodiment of the present invention, when the first and second memory units 420 and 430 have different latencies (i.e., when the first memory 130 working as the memory caches 131 and 135 has different latency from the second memory 150 working as the system memory 151B: for example, when the second latency latency_F of the second memory unit 430 is greater than the first latency latency_N of the first memory unit 420) in the memory system 400 where the processor 170 and the first and second memory units 420 and 430 are coupled to each other, the processor 170 may operate with the first memory unit 420 during the second latency latency_F of the second memory unit 430 thereby improving the overall data transmission rate.

In an embodiment, during the second latency latency_F of the second memory unit 430 which represents a time gap between when the processor 170 provides the data request signal to the second memory unit 430 and when the processor 170 receives the requested data from the second memory unit 430, the processor 170 may provide the data request signal to the first memory unit 420 and receive the requested data from the first memory unit 420.

Each of the first and second memory units 420 and 430 may be a memory module or a memory package. In an embodiment, each of the memories included in the first and second memory units 420 and 430 may be of the same memory technology (e.g., the DRAM technology) but may have different latencies from each other.

Each of the first and second memory units 420 and 430 may include a serial presence detect SPD as the memory information storage unit. For example, information, such as the storage capacity, the operation speed, the address, the latency, and so forth of each memory included in each of the first and second memory units 420 and 430 may be stored in the serial presence detect SPD. Therefore, the processor 170 may identify the latency of each memory included in each of the first and second memory units 420 and 430.

Figure 7:
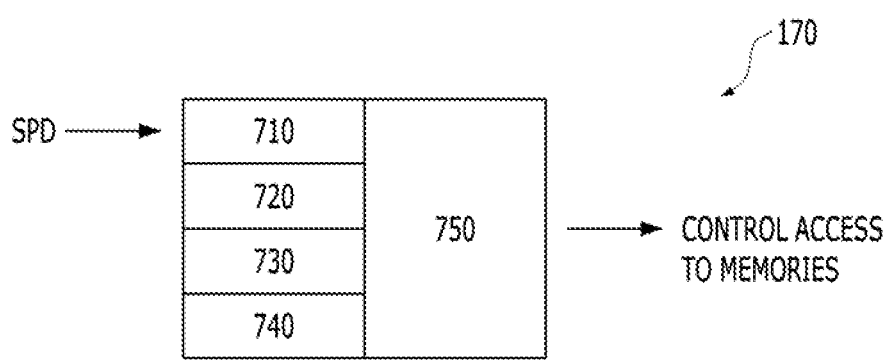
FIG. 7 is a block diagram illustrating an example of a processor of FIG. 6A.
Figure 8:
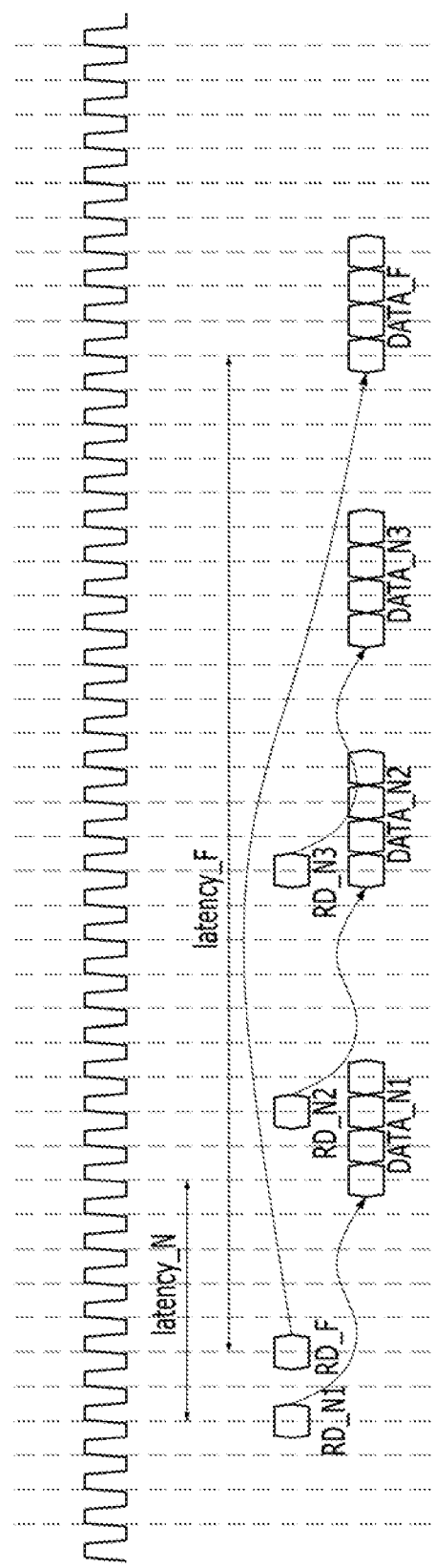
FIG. 8 is a timing diagram illustrating an example of a memory access control of the memory system of FIG. 6A.

FIG. 7 is a block diagram illustrating an example of the processor 170 of FIG. 6A. FIG. 8 is a timing diagram illustrating an example of a memory access control of the memory system 400 of FIG. 6A.

Referring to FIG. 7, the processor 170 may include a memory identification unit 710, a first memory information storage unit 720, a second memory information storage unit 730, a memory selection unit 740 and a memory control unit 750 further to the elements described with reference to FIG. 3. Each of the memory identification unit 710, the first memory information storage unit 720, the second memory information storage unit 730, the memory selection unit 740 and the memory control unit 750 may be a logical construct that may comprise one or more of hardware and micro-code extensions to support the first and second memory units 420 and 430.

The memory identification unit 710 may identify each of the first and second memory units 420 and 430 coupled to the processor 170 based on the information such as the storage capacity, the operation speed, the address, the latency, and so forth of each memory included in each of the first and second memory units 420 and 430 provided from the memory information storage unit (e.g., the serial presence detect SPD) of the respective first and second memory units 420 and 430.

The first and second memory information storage units 720 and 730 may respectively store the information of each memory included in the first and second memory units 420 and 430 provided from the memory information storage units of the first and second memory units 420 and 430. Even though FIG. 7 exemplifies two memory information storage units supporting two memories included in the first and second memory units 420 and 430, the number of the memory information storage units may vary according to system design.

The memory control unit 750 may control the access to the first and second memory units 420 and 430 through the memory selection unit 740 based on the information of each memory included in the first and second memory units 420 and 430, particularly the latency, stored in the first and second memory information storage units 720 and 730. As described above, the signals exchanged between the processor 170 and the first memory unit 420 and the signals exchanged between the processor 170 and the second memory unit 430 via the first memory unit 420 may include the memory selection information field and the handshaking information field as well as the memory access request field and the corresponding response field (e.g., the read command, the write command, the address, the data and the data strobe). That is, the memory control unit 750 may control the access to the first and second memory units 420 and 430 through the memory selection information field indicating the destination of the signal between the first and second memory units 420 and 430 when the processor 170 provides the memory access request (e.g., the read command to the first memory unit 420 or the second memory unit 430).

FIGS. 6B and 8 exemplifies the memory system 400, in which the second latency latency_F of the second memory 150 working as the system memory 151B in the second memory unit 430 is greater than the first latency latency_N of the first memory 130 working as the memory caches 131 and 135 in the first memory unit 420.

Referring to FIGS. 6B and 8, the processor 170 may provide the first memory unit 420 with the data request (e.g., a first read command RD_N1) to the first memory unit 420. In response to the first read command RD_N1, the processor 170 may receive the requested data DATA_N1 from the first memory unit 420 the first latency latency_N after the provision of the first read command RD_N1.

For example, the processor 170 may provide the read command RD_F to the second memory unit 430 if needed during the first latency latency_N indicating time gap between when the processor 170 provides the first read command RD_N1 to the first memory unit 420 and when the processor 170 receives the read data DATA_N1 from the first memory unit 420 in response to the first read command RD_N1. In response to the read command RD_F to the second memory unit 430, the processor 170 may receive the requested data DATA_F from the second memory unit 430 the second latency latency_F after the provision of the read command RD_F.

Here, the processor 170 may identify each of the first and second memory units 420 and 430 through the memory identification unit 710. Also, the processor 170 may store the information (e.g., the storage capacity, the operation speed, the address, the latency, and so forth) of each memory included in the first and second memory units 420 and 430 provided from the memory information storage units (e.g., the SPDs) of the first and second memory units 420 and 430 through the first and second memory information storage units 720 and 730. That is, the processor 170 may identify the first and second latencies latency_N and latency_F of different size, and therefore the processor 170 may access the first and second memory units 420 and 430 without data collision even though the processor 170 provides the read command RD_F to the second memory unit 430 during the first latency latency_N of the first memory unit 420.

For example, during the second latency latency_F between when the read command RD_F is provided from the processor 170 to the second memory unit 430 and when the requested data DATA_F is provided from the second memory unit 430 to the processor 170, when the processor 170 is to request another data DATA_N2 from the first memory unit 420 after the processor 170 receives the previously requested data DATA_N1 from the first memory unit 420 according to the first read command RD_N1 to the first memory unit 420, the processor 170 may provide a second read command RD_N2 to the first memory unit 420. Because the processor 170 knows the first latency latency_N and the second latency latency_F of different size, the processor 170 may access the first memory unit 420 while awaiting the response (i.e., the requested data DATA_F) from the second memory unit 430 without data collision even though the processor 170 provides the second read command RD_N2 to the first memory unit 420 during the second latency latency_F of the second memory unit 430. For example, as illustrated in FIG. 8, the processor 170 may provide the second read command RD_N2 to the first memory unit 420 and may receive the requested data DATA_N2 from the first memory unit 420 after the first latency latency_N during the second latency latency_F between when the read command RD_F is provided from the processor 170 to the second memory unit 430 and when the requested data DATA_F is provided from the second memory unit 430 to the processor 170.

For example, during the second latency latency_F between when the read command RD_F is provided from the processor 170 to the second memory unit 430 and when the requested data DATA_F is provided from the second memory unit 430 to the processor 170, when the processor 170 is to request another data DATA_N3 from the first memory unit 420 after the processor 170 receives the previously requested data DATA_N2 from the first memory unit 420 according to the second read command RD_N2 to the first memory unit 420, the processor 170 may provide a third read command RD_N3 to the first memory unit 420. Because the processor 170 knows that the first latency latency_N and the second latency latency_F are of different size, the processor 170 may access the first memory unit 420 while awaiting the response (i.e., the requested data DATA_F) from the second memory unit 430 without data collision even though the processor 170 provides the third read command RD_N3 to the first memory unit 420 during the second latency latency_F of the second memory unit 430. For example, as illustrated in FIG. 8, the processor 170 may provide the third read command RD_N3 to the first memory unit 420 and may receive the requested data DATA_N3 from the first memory unit 420 after the first latency latency_N during the second latency latency_F between when the read command RD_F is provided from the processor 170 to the second memory unit 430 and when the requested data DATA_F is provided from the second memory unit 430 to the processor 170.

As described above, the processor 170 may minimize wait time for the access to each of the first and second memory units 420 and 430 of the memory system 400 respectively having different first latency latency_N and second latency latency_F.

In accordance with an embodiment of the present invention, in the memory system 400 or 600 including the processor 170 and the two-level memory sub-system 440, when the first memory 130 working as the memory caches 131 and 135 and the second memory 150 working as the system memory 151B have different latencies (e.g., when the second latency latency_F of the second memory 150 working as the system memory 151B is greater than the first latency latency_N of the first memory 130 working as the memory caches 131 and 135), the processor 170 may operate with the first memory 130 working as the memory caches 131 and 135 during the second latency latency_F of the second memory 150 working as the system memory 151B thereby improving the overall data transmission rate.

As described above, the first memory unit 420 may communicate with each of the processor 170 and the second memory 150, and the processor 170 and the second memory unit 430 may communicate with each other through routing of the first memory unit 420. The first memory unit 420 may perform the routing operation to the signal provided from each of the processor 170 and the second memory unit 430 according to at least one of the memory selection information field and the handshaking information field included in the signal. When buses coupling between the processor 170 and the first memory unit 420 and between the first and second memory units 420 and 430 are occupied by a first signal transferred among the processor 170 and the first and second memory units 420 and 430, the first memory unit 420 may temporarily store a second signal transferred among the processor 170 and the first and second memory units 420 and 430. When the occupation of the buses by the first signal is released, the first memory unit 420 may provide the destination with the temporarily stored second signal. Therefore, the first memory unit 420 may provide the destination with the first and second signals, which are to be transferred among the processor 170 and the first and second memory units 420 and 430, without signal collision.

Figure 9:
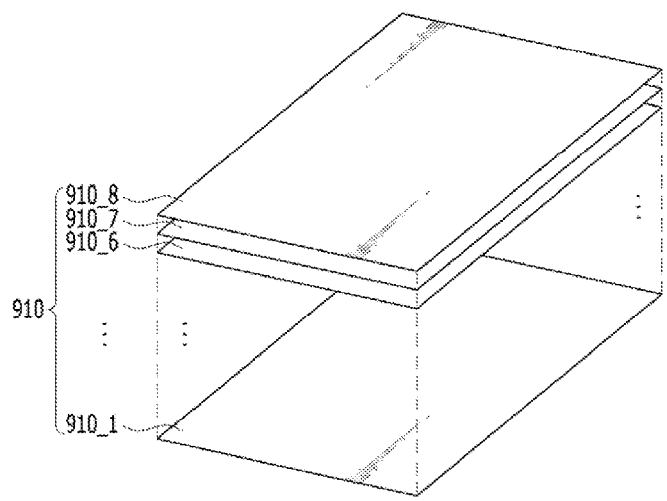
FIG. 9 is a schematic diagram illustrating a nonvolatile random access memory as a second memory according to an embodiment of the present invention.

FIG. 9 is a schematic diagram illustrating a nonvolatile random access memory (NVRAM) as the second memory 150 according to an embodiment of the present invention.

As described above, the second memory 150 may be implemented with the NVRAM. The NVRAM may include one or more of the ferroelectric random access memory (FRAM) using a ferroelectric capacitor, the magnetic random access memory (MRAM) using the tunneling magnetoresistive (TMR) layer, the phase change random access memory (PRAM) using a chalcogenide alloy, the resistive random access memory (RERAM) using a transition metal oxide, the spin transfer torque random access memory (STT-RAM), and the like. For example, the NVRAM using a resistance material may store data through a change in resistance of a variable resistive material (in case of the RERAM), a change in state of a phase change material such as a chalcogenide alloy (in case of the PRAM), and a change in resistance of a magnetic tunnel junction (MTJ) thin film due to a magnetization state of a ferromagnetic substance (in case of the MRAM).

A resistive memory cell may include an upper electrode, a lower electrode, and a variable resistive element interposed therebetween. A resistance level of the variable resistive element may vary according to a voltage applied between the upper and lower electrodes. A filament serving as a current path of a cell current may be formed in the variable resistive element. A state where the filament is partially disconnected is defined as a reset state or a high-resistance state corresponding to a reset data (i.e., data 1). A state where the filament is connected is defined as a set state or a low-resistance state corresponding to a set data (i.e., data 0).

A defective memory cell having a defect among the memory cells in the NVRAM may be repaired with a redundancy memory cell in the NVRAM. For example, the defective memory cell may be repaired by replacing a word line coupled to the defective memory cell with a redundancy word line coupled to the redundancy memory cell. Alternatively, the defective memory cell may be repaired by replacing a bit line coupled to the defective memory cell with a redundancy bit line coupled to the redundancy memory cell. Hereinafter, exemplified is the repair operation of replacing the bit line, which is a mere example, and the repair operation of replacing the word line will also fall in the scope of the present invention.

Referring to FIG. 9, the NVRAM may include a stacked memory cell array 910.

The stacked memory cell array 910 may include a plurality of memory cell layers 910_1 to 910_8 stacked in a vertical direction. FIG. 9 exemplifies eight numbers of stacked memory cell layers 910_1 to 910_8, but the present invention is not limited thereto. Each of the memory cell layers 910_1 to 910_8 may include a plurality of memory cell groups, a plurality of redundancy memory cell groups or a plurality of memory cell groups and redundancy memory cell groups.

Figure 10:
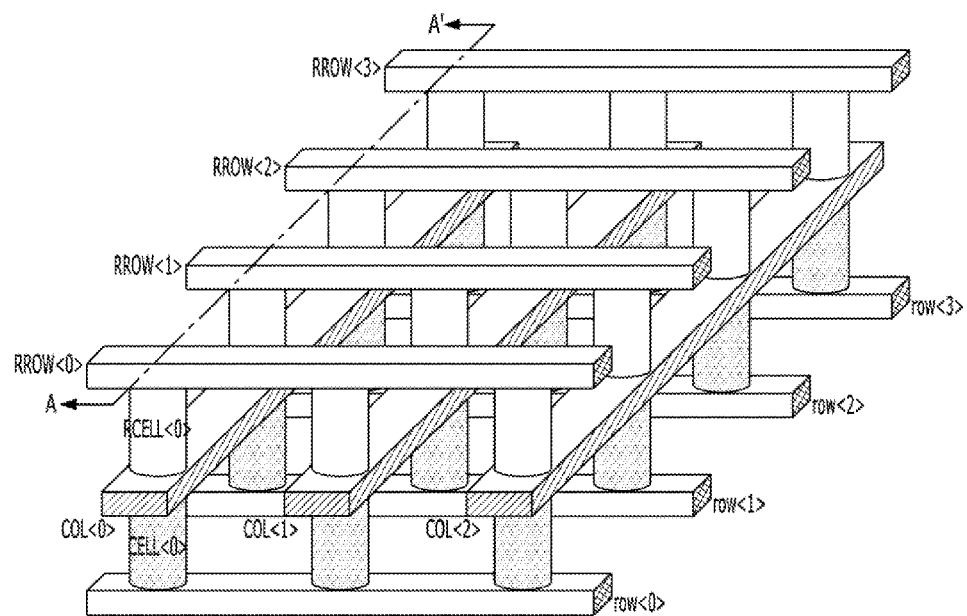
FIG. 10 is a perspective view illustrating respective layers of a stacked memory cell array of the nonvolatile random access memory of FIG. 9.

FIG. 10 is a perspective view illustrating respective layers of the stacked memory cell array 910 of the NVRAM of FIG. 9.

Each of the memory cell layers 910_1 to 910_8 may have the cross point structure shown in FIG. 10. As exemplified in FIG. 10, each layer of the stacked memory cell array 910 may include a first plurality of word lines row<0:3> extending in a first direction in a first plane, and a second plurality of word lines RROW<0:3> extending in the first direction in a second plane. The second plane may be parallel to the first plane. The first plurality of word lines row<0:3> may be spaced apart at regular intervals along a second direction perpendicular to the first direction in the first plane. The second plurality of word lines RROW<0:3> may be spaced apart at regular intervals along the second direction in the second plane. Further, each layer of the stacked memory cell array 910 may include a plurality of bit lines COL<0:2> extending in the second direction and spaced apart at regular intervals along the first direction in a third plane, which is parallel to the first and second planes and positioned between the first and second planes. Hence when viewed from the top, the plurality of bit lines COL<0:2> may cross over the first plurality of word lines row<0:3> and the second plurality of word lines RROW<0:3> may cross over the bit lines COL<0:2> thus defining intersections between respective word lines row<0:3> and RROW<0:3> and respective bit lines COL<0:2>.

As illustrated in FIG. 10, in the cross point structure, a single memory cell NVRAM cell CELL<0> may be formed at each intersection between respective word lines row<0:3> and respective bit lines COL<0:2>. Also, a single memory cell RCELL<0> may be formed at each intersection between respective word lines RROW<0:3> and respective bit lines COL<0:2>. FIG. 10 exemplifies a single memory cell layer 910_1 among the memory cell layers 910_1 to 910_8.

For example, the NVRAM cell CELL<0> may be a resistive memory cell. In this case, the NVRAM cell CELL<0> may include a variable resistive element and an access element, which are connected in series. For example, the variable resistive element may include NiO or perovskite. The perovskite may be a composition such as a manganite (e.g., $Pr_{0.7}Ca_{0.3}MnO_3$, $Pr_{0.5}Ca_{0.5}MnO_3$, phosphorus calcium manganese oxide (PCMO), or a lanthanum calcium manganese oxide (LCMO)), a titanate (e.g., a doped strontium oxide (STO), STO:Cr), a zirconate (e.g., a samarium zirconate (SZO), SZO:Cr, $Ca_2Nb_2O_7$:Cr, or $Ta_2O_5$:Cr), or the like. In particular, the filament may be formed in the variable resistive element, and the filament may serve as a current path of a cell current flowing through the NVRAM cell CELL<0>. The access element may be a diode.

Figure 11A:
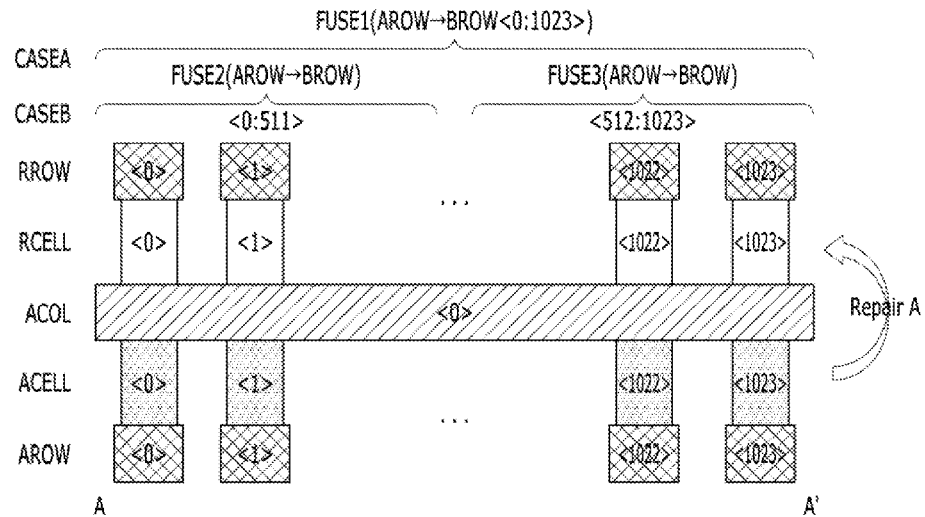
FIGS. 11A and 11B are cross-sectional diagrams illustrating the layers of the stacked memory cell array along line A-A' of FIG. 10.
Figure 11B:
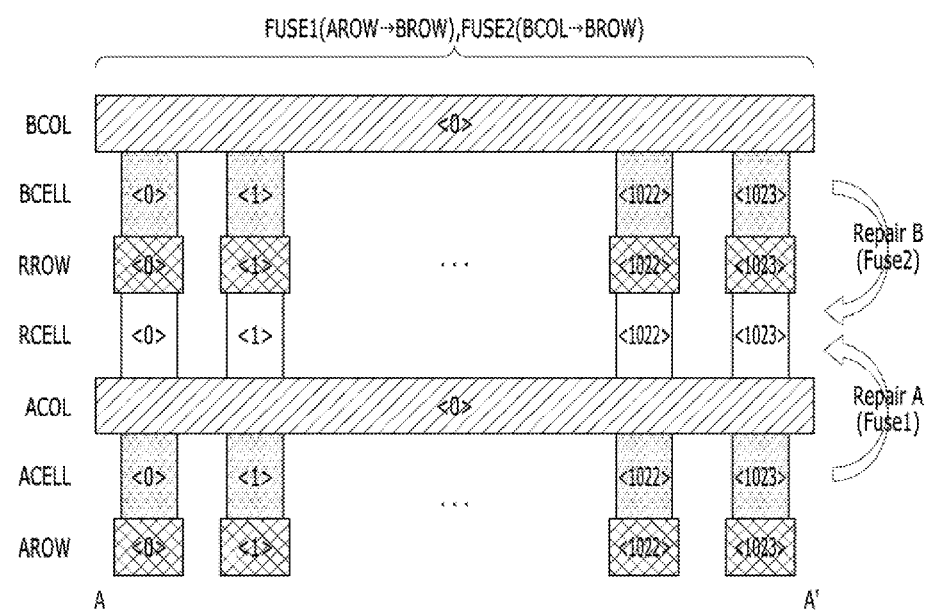

FIGS. 11A and 11B are cross-sectional diagrams illustrating the layers of the stacked memory cell array 910 along line A-A' of FIG. 10.

Referring to FIGS. 11A and 11B, each layer of the stacked memory cell array 910 of the NVRAM may include the plurality of word lines AROW<0:1023> and RROW<0:1023>, and the plurality of bit lines ACOL and BCOL. The plurality of word lines AROW<0:1023> and RROW<0:1023> and the plurality of bit lines ACOL and BCOL may cross each other. The plurality of NVRAM cells ACELL<0:1023>, BCELL<0:1023> and RCELL<0:1023> may be formed at the intersections of the plurality of word lines AROW<0:1023> and RROW<0:1023> and the plurality of bit lines ACOL and BCOL.

FIG. 11A illustrates a first embodiment replacing a defective memory cell group ACELL<0:1023> of a first memory cell layer with a repair memory cell group RCELL<0:1023> of a second memory cell layer by changing a word line AROW<0:1023> to a word line RROW<0:1023> through a fuse unit 1440, which will be described with reference to FIGS. 14 and 15A to 15C. In the first embodiment, the defective memory cell group ACELL<0:1023> of the first memory cell layer and the repair memory cell group RCELL<0:1023> of the second memory cell layer may be disposed in different memory cell layers while sharing the bit line ACOL.

FIG. 11B illustrates a second embodiment replacing the defective memory cell group ACELL<0:1023> of the first memory cell layer with the repair memory cell group RCELL<0:1023> of the second memory cell layer by changing the word line AROW<0:1023> to the word line RROW<0:1023> through the fuse unit 1440 or replacing a defective memory cell group BCELL<0:1023> of a third memory cell layer with the repair memory cell group RCELL<0:1023> of the second memory cell layer by changing a bit line BCOL to a bit line ACOL through the fuse unit 1440. In the second embodiment, the defective memory cell group ACELL<0:1023> of the first memory cell layer and the repair memory cell group RCELL<0:1023> of the second memory cell layer may be disposed in different memory cell layers while sharing the bit line ACOL. Also in the second embodiment, the defective memory cell group BCELL<0:1023> of the third memory cell layer and the repair memory cell group RCELL<0:1023> of the second memory cell layer may be disposed in different memory cell layers while sharing the word line RROW<0:1023>.

Figure 12:
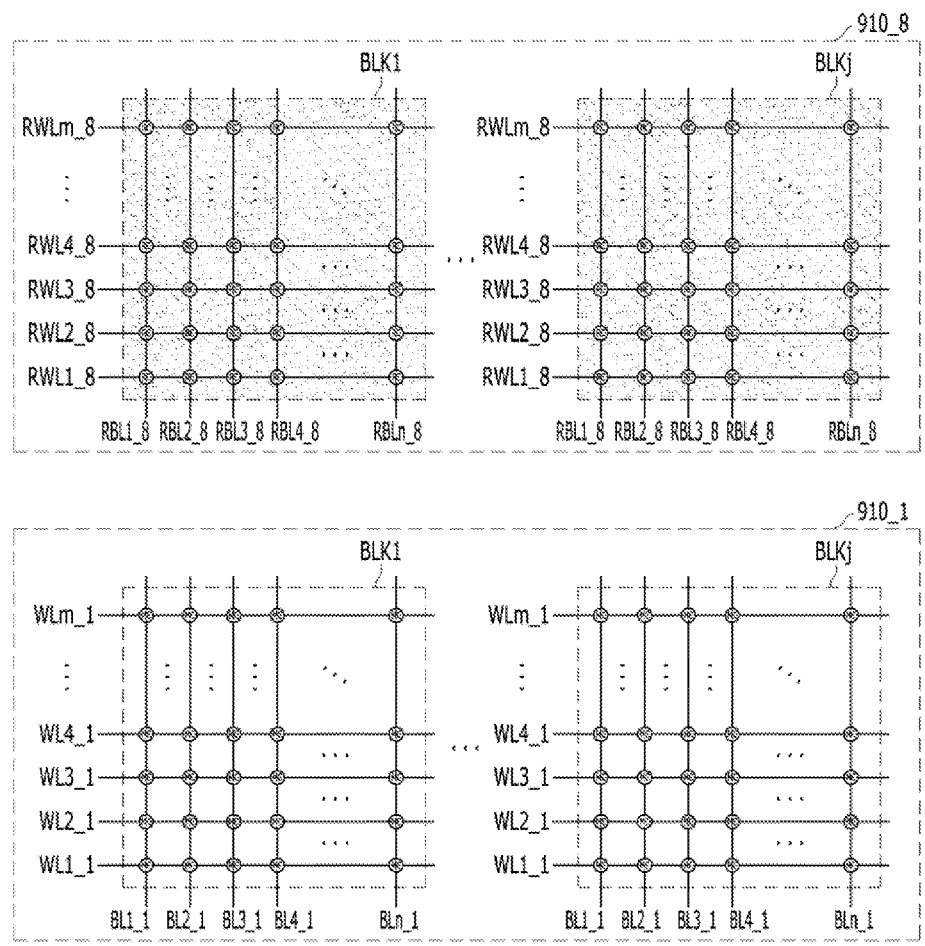
FIG. 12 is a schematic diagram illustrating the respective layers of stacked memory cell array of the nonvolatile random access memory of FIG. 9.

FIG. 12 is a schematic diagram illustrating the respective layers of stacked memory cell array 910 of the NVRAM of FIG. 9.

Referring to FIG. 12, the stacked memory cell array 910 of the NVRAM may include at least one first memory cell layer 910_1 and at least one second memory cell layer 910_8. The first memory cell layer 910_1 may include a plurality (e.g., a number of "j") of first memory cell blocks BLK1 to BLKj, each of which includes a plurality of NVRAM cells MC coupled at intersections between a plurality (e.g., a number of "m") of word lines WL1_1 to WLm_1 and a plurality (e.g., a number of "n") of bit lines BL1_1 to BLn_1. The second memory cell layer 910_8 may include a plurality (e.g., a number of "j") of second memory cell blocks BLK1 to BLKj, each of which includes a plurality of redundancy NVRAM cells RC coupled at intersections between a plurality (e.g., a number of "m") of redundancy word lines RWL1_1 to RWLm_8 and a plurality (e.g., a number of "n") of redundancy bit lines BL1_1 to BLn_8.

Figure 13:
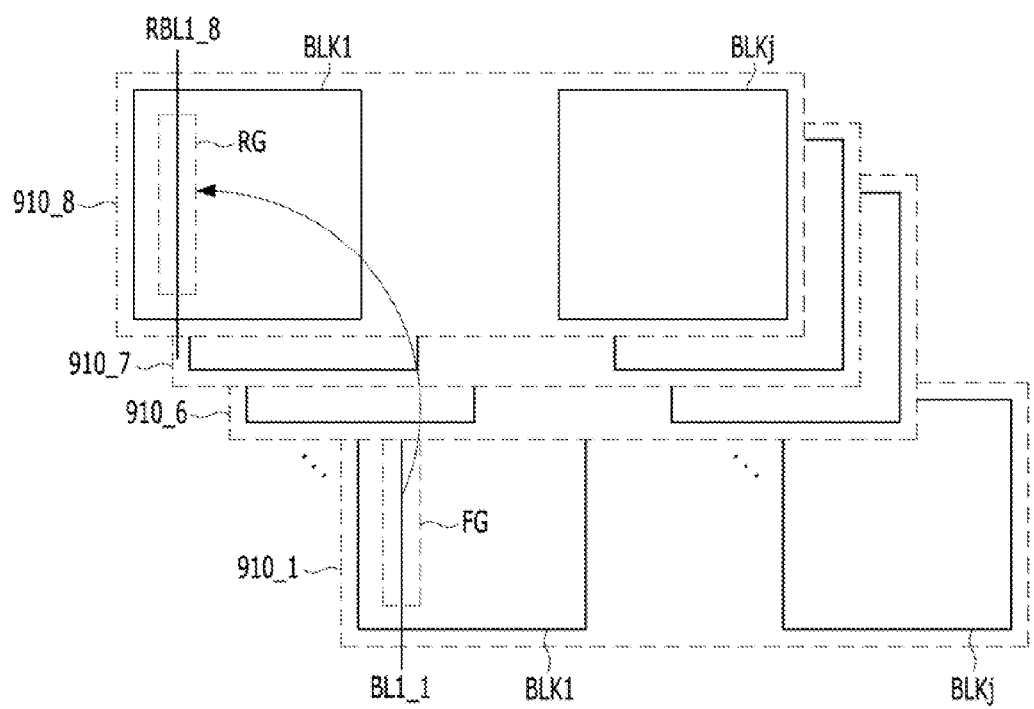
FIG. 13 is a schematic diagram illustrating a repair operation of the nonvolatile random access memory of FIG. 9.

FIG. 13 is a schematic diagram illustrating a repair operation of the NVRAM of FIG. 9.

Referring to FIG. 13, a repair control circuit (not shown) may repair a defective memory cell group FG in one (e.g., a first memory cell block BLK1) among the plurality of first memory cell blocks BLK1 to BLKj of the first memory cell layer 910_1 with a redundancy memory cell group RG in one (e.g., a second memory cell block BLK1) among the plurality of second memory cell blocks BLK1 to BLKj of the second memory cell layer 910_8. The first memory cell block BLK1 having the defective memory cell group FG may correspond to the same block address as the second memory cell block BLK1 having the plurality of redundancy NVRAM cells RC.

In the case that the defective memory cell group FG and the redundancy memory cell group RG are respectively disposed in different first and second memory cell layers 910_1 and 910_8 sharing word lines, the defective memory cell group FG may be repaired by replacing the defective memory cell group FG with the redundancy memory cell group RG through change of the bit line BL1_1 coupled to the defective memory cell group FG to the redundancy bit line RBL1_8 coupled to the plurality of redundancy NVRAM cells RC.

Figure 14:
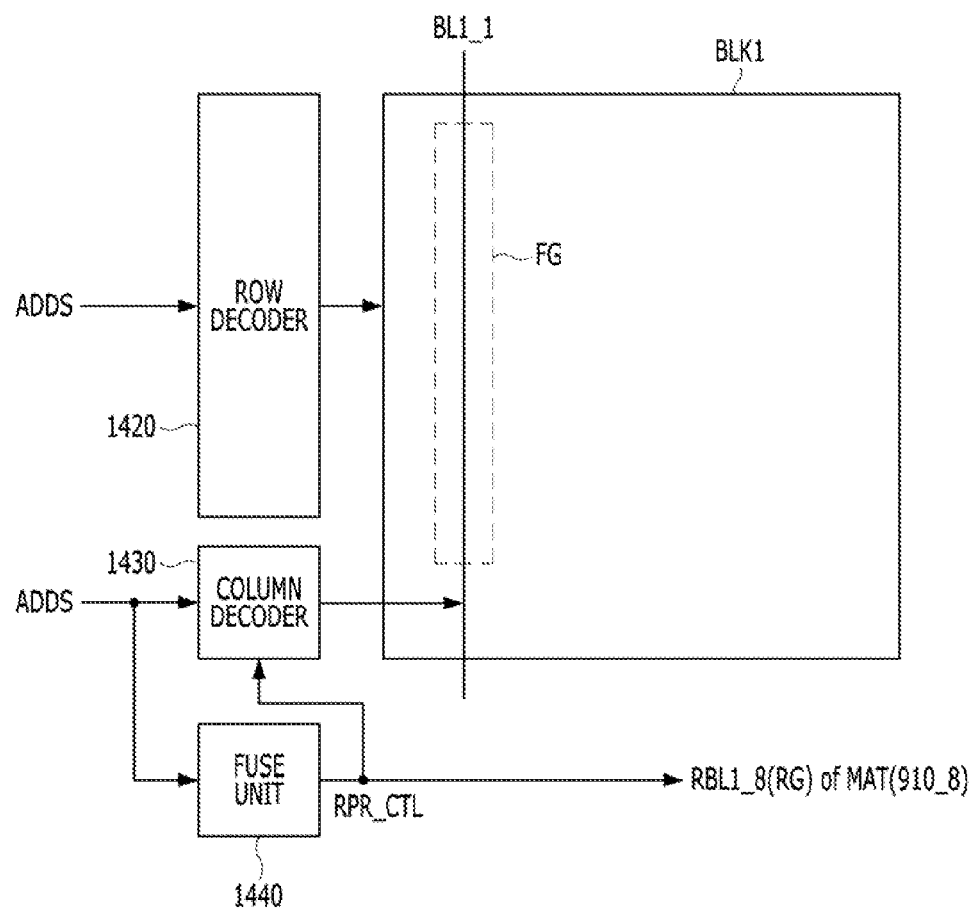
FIG. 14 is a block diagram illustrating the nonvolatile random access memory of FIG. 9.

FIG. 14 is a block diagram illustrating the NVRAM of FIG. 9.

Referring to FIG. 14, the NVRAM may include the first memory cell block BLK1 and a repair control circuit. The repair control circuit may represent any kind of circuit involved with the repair operation such as a row decoder 1420, a column decoder 1430, and a fuse unit 1440, each coupled either directly or indirectly to the first memory cell block BLK1. FIG. 14 exemplifies the defective memory cell group FG in the first memory cell block BLK1 of the first memory cell layer 910_1, but the NVRAM of FIG. 14 may include the stacked memory cell array 910 described above with reference to FIGS. 9 to 13.

The row decoder 1420 may receive and decode an address signal ADDS including a layer address LA, a block address BA, and a row address XA, and may select a word line in the first memory cell block BLK1. The column decoder 1430 may receive and decode the address signal ADDS including the layer address LA, the block address BA, and the column address YA, and may select a bit line in the first memory cell block BLK1.

The fuse unit 1440 may store an address corresponding to the defective memory cell group FG of the first memory cell block BLK1 of the first memory cell layer 910_1, and may compare an externally provided address and the stored address. For example, when the stored addresses and the externally provided address are the same as each other, the fuse unit 1440 may disable the column decoder 1430 and select the redundancy memory cell group (e.g., the redundancy memory cell group RG in the second memory cell block BLK1 of the second memory cell layer 910_8 described with reference to FIG. 13) by changing the bit line BL1_1 coupled to the defective memory cell group FG to the redundancy bit line RBL1_8 coupled to the redundancy memory cell group RG. The fuse unit 1440 may be coupled to the redundancy memory cell group RG through the redundancy bit line RBL1_8.

Figure 15A:
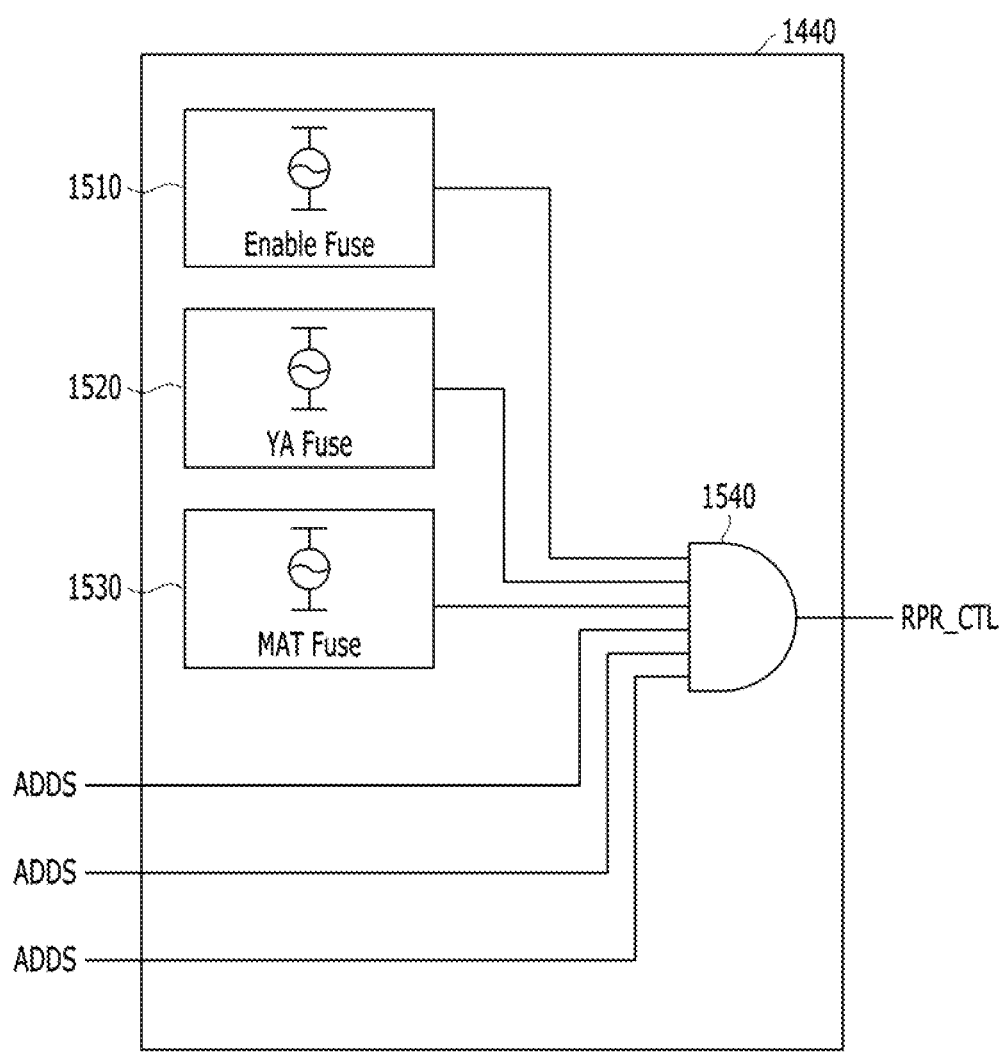
FIGS. 15A to 15C are circuit diagrams illustrating a fuse unit in the nonvolatile random access memory of FIG. 9.
Figure 15B:
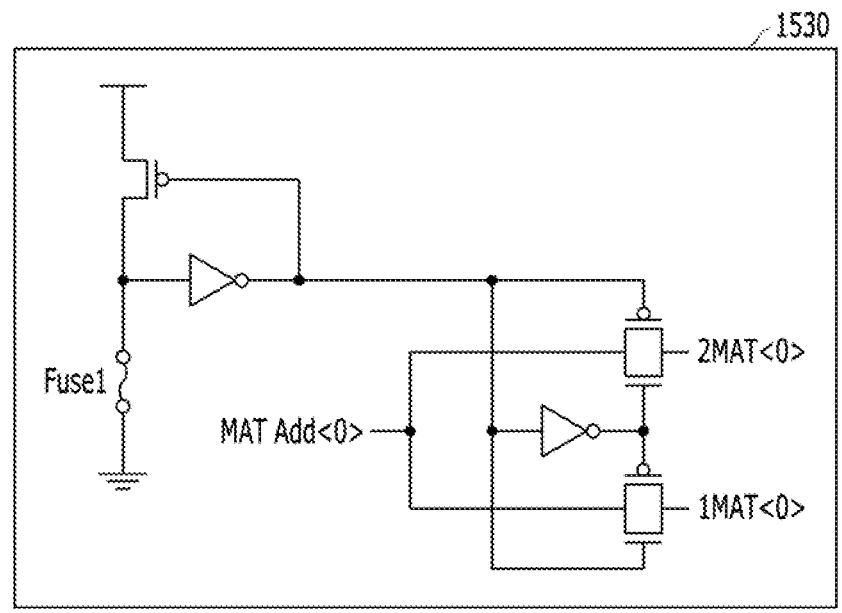
Figure 15C:
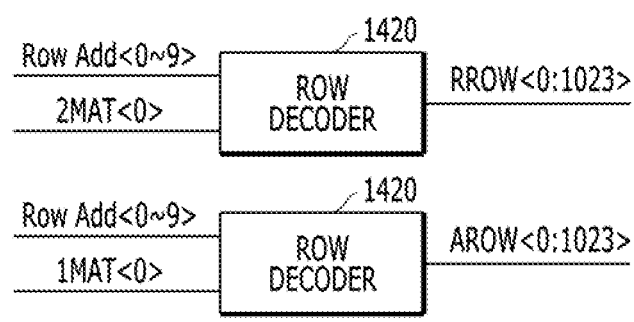

FIGS. 15A to 15C are circuit diagrams illustrating the fuse unit 1440 in the NVRAM of FIG. 9.

Referring to FIG. 15A, the fuse unit 1440 may include an enable fuse 1510, an address fuse 1520, a layer address fuse 1530 and a gate section 1540. The enable fuse 1510 may enable the fuse unit 1440. The address fuse 1520 may store a column address corresponding to the defective memory cell group FG. The layer address fuse 1530 may store a layer address corresponding to the second memory cell layer 910_8 including the redundancy memory cell group RG, and/or a layer address corresponding to the first memory cell layer 910_1 including the defective memory cell group FG. The gate section 1540 may output a repair control signal RPR_CTL by performing a logic operation to output signals from the enable fuse 1510, the address fuse 1520, and the layer address fuse 1530, and the address signal ADDS including the layer address LA, the block address BA and the column address YA.

In accordance with an embodiment of the present invention, an block address fuse for storing the block address BA may not be required since the first memory cell block BLK1 having the defective memory cell group FG corresponds to the same block address as the second memory cell block BLK1 having the redundancy memory cell group RG. FIG. 15A exemplifies an AND gate as the gate section 1540, which will not limit the scope of the present invention.

FIGS. 13 to 15A exemplify as an embodiment the repair operation replacing the defective memory cell group FG with the redundancy memory cell group RG by changing the bit line BL1_8 coupled to the defective memory cell group FG to the bit line RBL1_8 coupled to the redundancy memory cell group RG. In another embodiment, the defective memory cell group FG may be replaced with the redundancy memory cell group RG by changing the word line coupled to the defective memory cell group FG to the word line coupled to the redundancy memory cell group RG.

For example, referring back to FIG. 11A, when the defective memory cell group ACELL<0:1023> (i.e., the defective memory cell group FG) and the repair memory cell group RCELL<0:1023> (i.e., the redundancy memory cell group RG) are disposed in different memory cell layers (e.g., respectively disposed in the first memory cell layer 910_1 and the second memory cell layer 910_8) while sharing the bit line ACOL, the repair operation of replacing the defective memory cell group ACELL<0:1023> with the repair memory cell group RCELL<0:1023> may be performed by changing the word line AROW<0:1023> coupled to the defective memory cell group ACELL<0:1023> to the word line RROW<0:1023> coupled to the repair memory cell group RCELL<0:1023>.

In this embodiment, instead of the column decoder 1430 of FIG. 14, the row decoder 1420 may change the word lines in response to the repair control signal RPR_CTL of the fuse unit 1440.

In this embodiment, referring to FIGS. 15B and 15C, when a fuse Fuse1 of the layer address fuse 1530 is turned off, a layer address 2MAT<0> corresponding to the second memory cell layer 910_8 having the repair memory cell group RCELL<0:1023> may be enabled. According to the enablement of the layer address 2MAT<0> corresponding to the second memory cell layer 910_8, the row decoder 1420 may change the word line AROW<0:1023> coupled to the defective memory cell group ACELL<0:1023> to the word line RROW<0:1023> coupled to the repair memory cell group RCELL<0:1023>. In this way, the defective memory cell group ACELL<0:1023> may be repaired through the repair memory cell group RCELL<0:1023>.

When the fuse Fuse1 of the layer address fuse 1530 stays turned on, a layer address 1MAT<0> corresponding to the first memory cell layer 910_1 having the memory cell group ACELL<0:1023>, which has not failed or become defective yet, and the corresponding word line AROW<0:1023> may be enabled. According to the enablement of the layer address 1MAT<0> corresponding to the first memory cell layer 910_1, the row decoder 1420 may select the word line AROW<0:1023> coupled to the memory cell group ACELL<0:1023>.

While the present invention has been described with respect to the specific embodiments, it will be apparent to those skilled in the art that various changes and modifications may be made without departing from the spirit and scope of the invention as defined in the following claims.

What is claimed is:

1. A memory system comprising:
a first memory device including a first memory having a first latency and a first memory controller suitable for controlling the first memory to store data, the first memory device maintaining information of the first latency;
a second memory device including a second memory having a second latency different from the first latency and a second memory controller suitable for controlling the second memory to store data, the second memory device maintaining information of the second latency; and
a processor suitable for executing an operating system (OS) and an application to access a data storage memory through the first and second memory devices, accessing the second memory device through the first memory device, and communicating with each of the first and second memories according to the information of the first and second latencies provided from the first and second memory devices,
wherein the first and second memories are separated from the processor,
wherein the first memory controller transfers a signal between the processor and the second memory device based on at least one of values of a memory selection field and a handshaking information field included in the signal,
wherein the processor communicates with the first memory during the second latency for a communication with the second memory, and
wherein the second memory device includes:
a stacked memory cell array including a plurality of stacked memory cell layers, the respective stacked memory cell layers including a plurality of memory cell groups and/or a plurality of redundancy memory cell groups; and
a repair control circuit suitable for performing a repair operation to replace a defective memory cell group among the plurality of memory cell groups with one among the plurality of redundancy memory cell groups.

2. The memory system of claim 1, wherein the value of the memory selection field indicates one of the first and second memory devices as a destination of the signal.

3. The memory system of claim 1, wherein the value of the memory selection field indicates two or more among the processor and the first and second memory devices as a source and a destination of the signal.

4. The memory system of claim 1, wherein the value of the handshaking information field indicates the signal as one of a data request signal from the processor to the second memory, a data ready signal from the second memory to the processor and a session start signal from the processor to the second memory.

5. The memory system of claim 1, wherein the first memory device is a volatile memory device.

6. The memory system of claim 1, wherein the second memory device is a non-volatile memory device.

7. The memory system of claim 6, wherein the non-volatile memory device is a non-volatile random access memory device.

8. The memory system of claim 1,
wherein the stacked memory cell layers includes at least one first memory cell layer and at least one second memory cell layer,
wherein the at least one first memory cell layer includes the plurality of memory cell groups, and
wherein the at least one second memory cell layer includes the plurality of redundancy memory cell groups.

9. The memory system of claim 8,
wherein the repair control circuit performs the repair operation to the defective memory cell group by replacing the defective memory cell group of the first memory cell layer with the redundancy memory cell group of the second memory cell layer, and wherein the defective memory cell group and the redundancy memory cell group correspond to the same block address.

10. The memory system of claim 9,
wherein the repair control circuit includes a fuse unit coupled to the redundancy memory cell groups, and
wherein the fuse unit includes:
an enable fuse suitable for enabling the fuse unit;
a layer address fuse suitable for storing a layer address corresponding to the first memory cell layer having the defective memory cell group; and
an address fuse suitable for storing a fail address corresponding to the defective memory cell group.

11. The memory system of claim 1, wherein the stacked memory cell array has a cross point structure.

12. The memory system of claim 1,
wherein each of the plurality of memory cell groups includes a plurality of memory cells defined at intersections of a plurality of first conductive lines extending in a first direction and a plurality of second conductive lines extending in a second direction,
wherein each of the plurality of redundancy memory cell groups includes a plurality of redundancy memory cells defined at intersections of a plurality of third conductive lines extending in the first direction and a plurality of fourth conductive lines extending in the second direction.

13. The memory system of claim 12, wherein the repair control circuit performs the repair operation by changing one of the plurality of second conductive lines coupled to a defective memory cell among the plurality of memory cells to one of the plurality of fourth conductive lines.

14. The memory system of claim 13, wherein the repair control circuit performs the repair operation by changing one or more of the plurality of first and second conductive lines coupled to one or more defective memory cells among the plurality of memory cells in a first memory cell layer among the plurality of memory cell layers to one or more of the plurality of third and fourth conductive lines coupled to one or more among the plurality of redundancy memory cells in a second memory cell layer among the plurality of memory cell layers.

15. A memory system comprising:
a first memory device including a first memory having a first latency and a first memory controller suitable for controlling the first memory to store data, the first memory device maintaining information of the first latency;
a second memory device including a second memory having a second latency different from the first latency and a second memory controller suitable for controlling the second memory to store data, the second memory device maintaining information of the second latency; and
a processor suitable for accessing the first memory, accessing the second memory through the first memory device, and communicating with each of the first and second memories according to the information of the first and second latencies provided from the first and second memory devices,
wherein the first memory controller transfers a signal between the processor and the second memory device based on at least one of values of a memory selection field and a handshaking information field included in the signal,
wherein the processor communicates with the first memory during the second latency for a communication with the second memory, and
wherein the second memory device includes:
a stacked memory cell array including a plurality of stacked memory cell layers, the respective stacked memory cell layers including a plurality of memory cell groups and/or a plurality of redundancy memory cell groups; and
a repair control circuit suitable for performing a repair operation to replace a defective memory cell group among the plurality of memory cell groups with one among the plurality of redundancy memory cell groups.

16. The memory system of claim 15, wherein the value of the memory selection field indicates one of the first and second memory devices as a destination of the signal.

17. The memory system of claim 15, wherein the value of the handshaking information field indicates the signal as one of a data request signal from the processor to the second memory, a data ready signal from the second memory to the processor and a session start signal from the processor to the second memory.

18. The memory system of claim 15,
wherein the stacked memory cell layers includes at least one first memory cell layer and at least one second memory cell layer,
wherein the at least one first memory cell layer includes the plurality of memory cell groups,
wherein the at least one second memory cell layer includes the plurality of redundancy memory cell groups,
wherein the repair control circuit performs the repair operation to the defective memory cell group by replacing the defective memory cell group of the first memory cell layer with the redundancy memory cell group of the second memory cell layer, and
wherein the defective memory cell group and the redundancy memory cell group correspond to the same block address.

* * * * *